(12) United States Patent
Sugiyama

(10) Patent No.: US 11,281,082 B2
(45) Date of Patent: Mar. 22, 2022

(54) PROJECTOR

(71) Applicant: SEIKO EPSON CORPORATION, Tokyo (JP)

(72) Inventor: Nobuo Sugiyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/025,423

(22) Filed: Sep. 18, 2020

(65) Prior Publication Data

US 2021/0088885 A1 Mar. 25, 2021

(30) Foreign Application Priority Data

Sep. 20, 2019 (JP) .............................. JP2019-171682

(51) Int. Cl.
   *G03B 21/16* (2006.01)
   *H04N 9/31* (2006.01)
   *H05K 7/20* (2006.01)

(52) U.S. Cl.
   CPC ........... *G03B 21/16* (2013.01); *H04N 9/3144* (2013.01); *H05K 7/20145* (2013.01)

(58) Field of Classification Search
   CPC ... G03B 21/16; H04N 9/3144; H05K 7/20145
   See application file for complete search history.

(56) References Cited

U.S. PATENT DOCUMENTS

| | | | | |
|---|---|---|---|---|
| 6,713,973 | B2* | 3/2004 | Erhardt | H05B 41/2928 315/291 |
| 7,438,420 | B2* | 10/2008 | Harada | H04N 9/3155 315/117 |
| 7,448,759 | B2* | 11/2008 | Fukano | H04N 5/74 353/85 |
| 7,891,819 | B2* | 2/2011 | Osumi | G03B 21/16 353/54 |
| 8,517,540 | B2 | 8/2013 | Terao | |
| 8,777,423 | B2* | 7/2014 | Okada | G03B 21/2086 353/85 |
| 10,514,594 | B2* | 12/2019 | Okada | H04N 9/315 |

(Continued)

FOREIGN PATENT DOCUMENTS

| | | |
|---|---|---|
| JP | H1 1-057383 A | 3/1999 |
| JP | H1 1-169644 A | 6/1999 |

(Continued)

*Primary Examiner* — Bao-Luan Q Le
(74) *Attorney, Agent, or Firm* — Oliff PLC

(57) ABSTRACT

A projector includes a cooling apparatus configured to cool a cooling target based on a transformation of a refrigerant into a gas. A refrigerant generator of the cooling apparatus includes a moisture absorbing and desorbing member, a first blower, a heat exchanger, a heater, and a second blower. The heat exchanger includes a housing having an internal space into which the air delivered by the second blower flows, and a heat absorbing portion disposed in the internal space, the heat absorbing portion removing heat from the air in the internal space to generate the refrigerant. The housing includes an inlet port through which the air flows into the internal space and an outlet port through which the air is exhausted from the internal space. An air guide portion configured to guide the air flowing into the internal space is disposed in the internal space.

18 Claims, 15 Drawing Sheets

(56) References Cited

U.S. PATENT DOCUMENTS

| | | | |
|---|---|---|---|
| 10,627,708 B2* | 4/2020 | Sugiyama | F25B 19/00 |
| 10,705,414 B2* | 7/2020 | Okada | F25B 19/00 |
| 10,712,643 B2* | 7/2020 | Sugiyama | F28D 15/0283 |
| 10,890,836 B1* | 1/2021 | Okada | H04N 9/3144 |
| 10,983,425 B2* | 4/2021 | Sugiyama | G03B 21/16 |
| 10,989,994 B2* | 4/2021 | Okada | G03B 21/16 |
| 11,009,784 B2* | 5/2021 | Sugiyama | F28D 15/02 |
| 11,029,587 B2* | 6/2021 | Sugiyama | G03B 21/16 |
| 11,029,588 B2* | 6/2021 | Sugiyama | G03B 21/005 |
| 11,163,223 B2* | 11/2021 | Sugiyama | G03B 21/16 |
| 11,163,224 B2* | 11/2021 | Sugiyama | G03B 21/16 |
| 2002/0191159 A1 | 12/2002 | Nagao et al. | |
| 2003/0218602 A1* | 11/2003 | Naito | H04N 5/74 345/204 |
| 2004/0212787 A1* | 10/2004 | Kida | G03B 21/18 353/94 |
| 2004/0239887 A1* | 12/2004 | Yasuda | H04N 5/74 353/57 |
| 2005/0219430 A1* | 10/2005 | Nagano | H04N 5/165 349/9 |
| 2005/0242741 A1* | 11/2005 | Shiota | H04N 9/31 315/112 |
| 2006/0082964 A1* | 4/2006 | Taniguchi | G03B 21/16 361/679.21 |
| 2006/0120084 A1* | 6/2006 | Sueoka | G03B 21/16 362/294 |
| 2008/0030689 A1* | 2/2008 | Hsu | G03B 21/16 353/57 |
| 2008/0297053 A1* | 12/2008 | Yun | G03B 21/2013 315/88 |
| 2009/0086169 A1 | 4/2009 | Nakamura | |
| 2010/0132379 A1 | 6/2010 | Wu et al. | |
| 2011/0025987 A1* | 2/2011 | Furumi | G03B 21/16 353/57 |
| 2011/0032489 A1* | 2/2011 | Kimoto | H04N 9/3144 353/56 |
| 2011/0037954 A1* | 2/2011 | Tsuchiya | G03B 21/16 353/54 |
| 2011/0242499 A1 | 10/2011 | Terao | |
| 2012/0229710 A1* | 9/2012 | Okazawa | H04N 9/3155 348/748 |
| 2013/0107223 A1* | 5/2013 | Toyooka | G03B 21/2033 353/31 |
| 2013/0128457 A1* | 5/2013 | Shioya | G02F 1/133385 361/695 |
| 2013/0128458 A1* | 5/2013 | Shioya | G02F 1/133385 361/695 |
| 2013/0148085 A1* | 6/2013 | Sakamoto | G03B 21/16 353/52 |
| 2013/0271736 A1* | 10/2013 | Terashima | G03B 21/2053 353/57 |
| 2014/0218693 A1* | 8/2014 | Kubo | H04N 9/3188 353/57 |
| 2015/0009218 A1* | 1/2015 | Fukutomi | H04N 9/3188 345/428 |
| 2015/0029469 A1* | 1/2015 | Kubo | G03B 21/16 353/57 |
| 2016/0105652 A1* | 4/2016 | Yamashita | H04N 9/3144 348/333.1 |
| 2018/0239227 A1* | 8/2018 | Suzuki | G03B 21/2026 |
| 2019/0005893 A1* | 1/2019 | Naitou | G03B 21/2053 |
| 2019/0196311 A1 | 6/2019 | Sugiyama et al. | |

FOREIGN PATENT DOCUMENTS

| | | |
|---|---|---|
| JP | H11-223464 A | 8/1999 |
| JP | 2002-107698 A | 4/2002 |
| JP | 2002-326012 A | 11/2002 |
| JP | 2002-372748 A | 12/2002 |
| JP | 2007-294655 A | 11/2007 |
| JP | 2009-086271 A | 4/2009 |
| JP | 2010-107751 A | 5/2010 |
| JP | 2011-036768 A | 2/2011 |
| JP | 2011-215457 A | 10/2011 |
| JP | 2014-087797 A | 5/2014 |
| JP | 2019-117332 A | 7/2019 |

* cited by examiner

PROJECTOR

The present application is based on, and claims priority from JP Application Serial Number 2019-171682, filed Sep. 20, 2019, the disclosure of which is hereby incorporated by reference herein in its entirety.

BACKGROUND

1. Technical Field

The present disclosure relates to a projector.

2. Related Art

JP-A-2019-117332 discloses a projector including a refrigerant production unit that produces a refrigerant. In the projector of JP-A-2019-117332, the refrigerant produced in the refrigerant production unit changes into a gas, and cools a cooling target of the projector.

In the above described projector, further improvement of refrigerant production efficiency in the refrigerant production unit is desired.

SUMMARY

An aspect of a projector of the present disclosure is directed to a projector having a cooling target, including a light source configured to emit a light, a light modulator configured to modulate the light emitted from the light source according to an image signal, and a cooling apparatus configured to cool the cooling target based on a transformation of a refrigerant into a gas. The cooling apparatus includes a refrigerant generator configured to generate the refrigerant, and a refrigerant sender configured to send the generated refrigerant toward the cooling target. The refrigerant generator includes a rotating moisture absorbing and desorbing member, a first blower configured to deliver air to a first part of the moisture absorbing and desorbing member located in a first region, a heat exchanger coupled to the refrigerant sender, a heater configured to heat a second part of the moisture absorbing and desorbing member located in a second region different from the first region, and a second blower configured to deliver air around the second part heated by the heater to the heat exchanger. The heat exchanger includes a housing having an internal space into which the air delivered by the second blower flows, and a heat absorbing portion disposed in the internal space, the heat absorbing portion removing heat from the air in the internal space to generate the refrigerant. The housing includes an inlet port through which the air flows into the internal space and an outlet port through which the air is exhausted from the internal space. An air guide portion configured to guide the air flowing into the internal space is disposed in the internal space.

The air guide portion may be located between the inlet port and the outlet port.

The inlet port may be provided in a first side wall portion at one side in a first direction out of a plurality of side wall portions forming the housing, and the outlet port may be provided in a second side wall portion at the other side in the first direction out of the plurality of side wall portions.

The inlet port and the outlet port may overlap each other as seen along the first direction, and the air guide portion may be located between the inlet port and the outlet port in the first direction.

The inlet port may be provided in a part closer to one side in a second direction orthogonal to the first direction in the first side wall portion, the outlet port may be provided in a part closer to the one side in the second direction in the second side wall portion, and a distance between the air guide portion and a third side wall portion at the other side in the second direction out of the plurality of side wall portions may be larger than a distance between the air guide portion and a fourth side wall portion at the one side in the second direction out of the plurality of side wall portions.

The inlet port may be provided in a part closer to one side in a third direction orthogonal to both the first direction and the second direction in the first side wall portion, the outlet port may be provided in a part closer to the one side in the third direction in the second side wall portion, and a distance between the air guide portion and a fifth side wall portion at the other side in the third direction out of the plurality of side wall portions may be larger than a distance between the air guide portion and a sixth side wall portion at the one side in the third direction out of the plurality of side wall portions.

Both the inlet port and the outlet port may be provided in the first side wall portion at the one side in the first direction out of the plurality of side wall portions forming the housing, and the air guide portion may be located between the inlet port and the outlet port as seen along the first direction.

A distance between the air guide portion and the second side wall portion at the other side in the first direction out of the plurality of side wall portions may be larger than a distance between the air guide portion and the first side wall portion.

The inlet port and the outlet port may be provided in a part closer to the one side in the second direction orthogonal to the first direction in the first side wall portion, and a distance between the air guide portion and the third side wall portion at the other side in the second direction out of the plurality of side wall portions may be larger than a distance between the air guide portion and the fourth side wall portion at the one side in the second direction out of the plurality of side wall portions.

The heat exchanger may include a fixing portion connecting the air guide portion and an inner wall surface of the housing and fixing the air guide portion, and the air guide portion may be disposed apart from the inner wall surface of the housing.

The air guide portion may have a curved shape.

The air guide portion may have a corrugated shape.

The air guide portion may have a through hole penetrating the air guide portion.

The air guide portion may contact the heat absorbing portion, and the air guide portion and the heat absorbing portion may be formed of metals.

The air guide portion may include an air guide portion main body and a projecting portion projecting from the air guide portion main body.

A plurality of the air guide portions may be provided.

The heat absorbing portion may be a channel having an inner part isolated from the internal space and a plurality of the heat absorbing portions are provided, and cooling air for cooling air in the internal space via the channel portions may circulate in the inner parts of the plurality of channels.

The cooling target may be the light modulator.

DESCRIPTION OF EXEMPLARY EMBODIMENTS

As below, projectors according to embodiments of the present disclosure will be explained with reference to the drawings. Note that the present disclosure is not limited to the following embodiments, but can be arbitrarily changed within the scope of the technical idea of the present disclosure. Further, in the following drawings, to clearly show the respective configurations, scaling, numbers, etc. in the respective structures may be made different from scaling, numbers, etc. in the real structures.

First Embodiment

Figure 1:
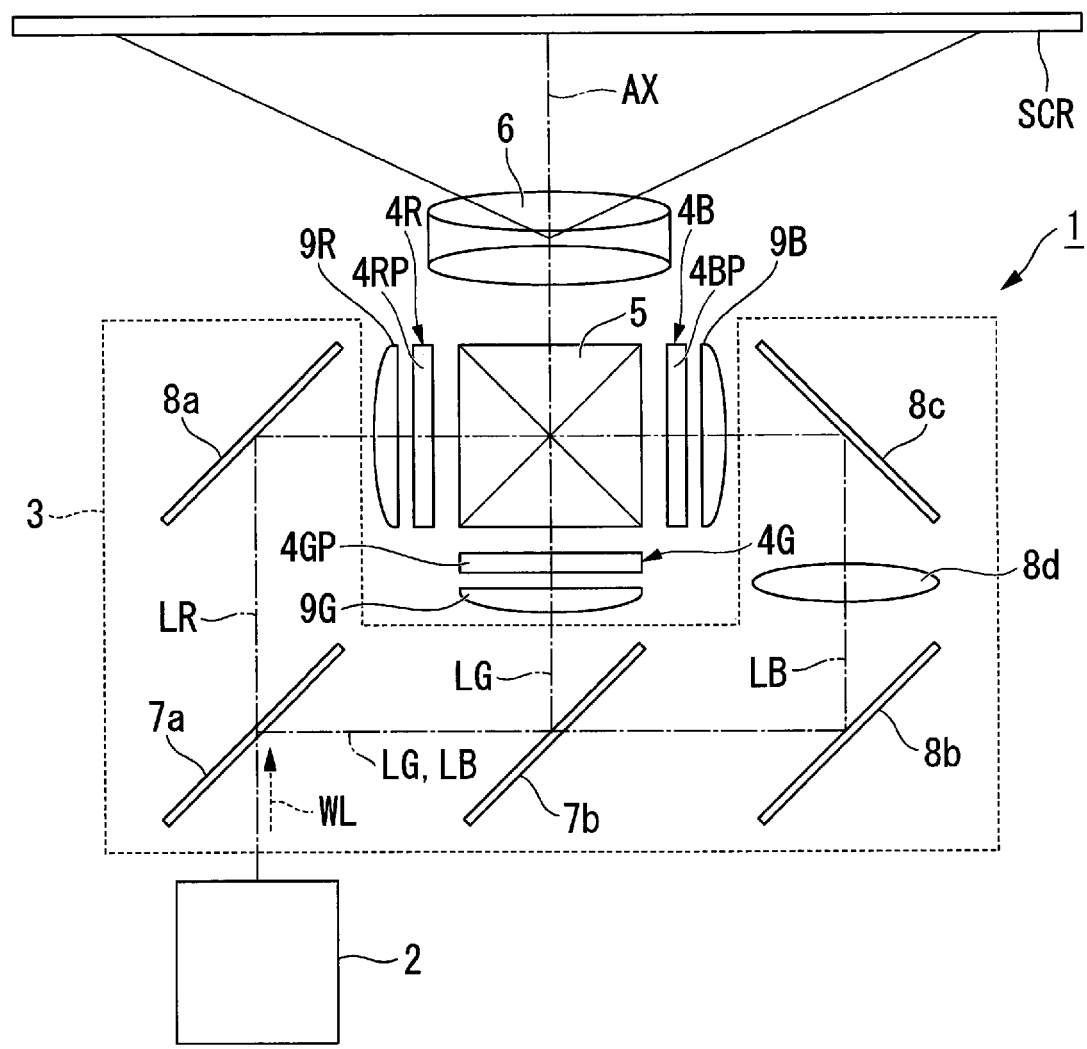
FIG. 1 is a schematic configuration diagram showing a projector of a first embodiment.
Figure 2:
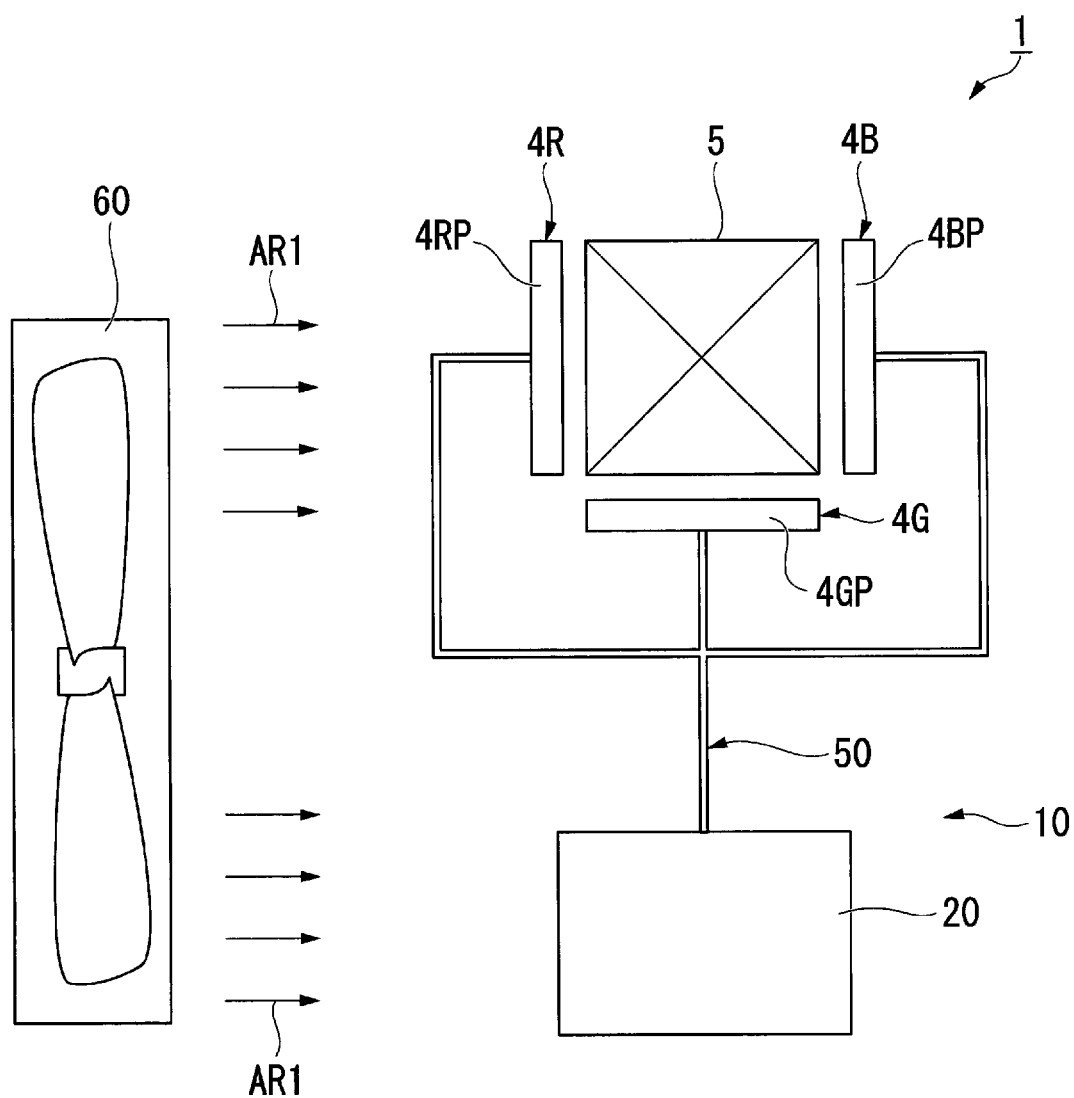
FIG. 2 is a schematic diagram showing a part of the projector of the first embodiment.

FIG. 1 is the schematic configuration diagram showing a projector 1 of the embodiment. FIG. 2 is the schematic diagram showing the part of the projector 1 of the embodiment. As shown in FIG. 1, the projector 1 includes a light source 2, a color separation system 3, a light modulation unit 4R, a light modulation unit 4G, a light modulation unit 4B, a light combining system 5, and a projection optical device 6. The light modulation unit 4R has a light modulator 4RP. The light modulation unit 4G has a light modulator 4GP. The light modulation unit 4B has a light modulator 4BP.

The light source 2 outputs an illumination light WL adjusted to have a substantially homogeneous illuminance distribution toward the color separation system 3. The light source 2 is e.g. a semiconductor laser. The color separation system 3 separates the illumination light WL from the light source 2 into a red light LR, a green light LG, and a blue light LB. The color separation system 3 includes a first dichroic mirror 7a, a second dichroic mirror 7b, a first reflection mirror 8a, a second reflection mirror 8b, a third reflection mirror 8c, and a relay lens 8d.

The first dichroic mirror 7a separates the illumination light WL output from the light source 2 into the red light LR and a light as a mixture of the green light LG and the blue light LB. The first dichroic mirror 7a has a property of transmitting the red light LR and reflecting the green light LG and the blue light LB. The second dichroic mirror 7b separates the light as a mixture of the green light LG and the blue light LB into the green light LG and the blue light LB. The second dichroic mirror 7b has a property of reflecting the green light LG and transmitting the blue light LB.

The first reflection mirror 8a is placed in the optical path of the red light LR and reflects the red light LR transmitted through the first dichroic mirror 7a toward the light modulator 4RP. The second reflection mirror 8b and the third reflection mirror 8c are placed in the optical path of the blue light LB and guide the blue light LB transmitted through the second dichroic mirror 7b to the light modulator 4BP.

The light modulator 4RP, the light modulator 4GP, and the light modulator 4BP respectively include liquid crystal panels. The light modulator 4RP modulates the red light LR of the lights output from the light source 2 according to an image signal. The light modulator 4GP modulates the green light LG of the lights output from the light source 2 according to an image signal. The light modulator 4BP modulates the blue light LB of the lights output from the light source 2 according to an image signal. Thereby, the respective light modulators 4RP, 4GP, 4BP form image lights corresponding to the respective color lights. Polarizers (not shown) are placed at the light incident sides and the light exiting sides of the respective light modulators 4RP, 4GP, 4BP.

A field lens 9R that parallelizes the red light LR entering the modulator 4RP is placed at the light incident side of the modulator 4RP. A field lens 9G that parallelizes the green light LG entering the modulator 4GP is placed at the light incident side of the modulator 4GP. A field lens 9B that parallelizes the blue light LB entering the modulator 4BP is placed at the light incident side of the modulator 4BP.

The light combining system 5 includes a cross dichroic prism having a substantially cubic shape. The light combining system 5 combines the image lights of the respective colors from the light modulators 4RP, 4GP, 4BP. The light combining system 5 outputs the combined image light toward the projection optical device 6. The projection optical device 6 includes a group of projection lenses. The projection optical device 6 enlarges and projects the image light combined by the light combining system 5, i.e., the lights modulated by the light modulators 4RP, 4GP, 4BP toward a screen SCR. Thereby, the enlarged color image (picture) is displayed on the screen SCR.

As shown in FIG. 2, the projector 1 further includes a cooling apparatus 10. The cooling apparatus 10 cools a cooling target provided in the projector 1 by a refrigerant W changing into a gas. In the embodiment, the refrigerant W is e.g. water in a liquid form. Accordingly, in the following description, the change of the refrigerant W into the gas may be simply referred to as vaporization. In the embodiment, the cooling target includes the light modulation units 4R, 4G, 4B. That is, in the embodiment, the cooling target includes the light modulators 4RP, 4GP, 4BP.

The cooling apparatus 10 has a refrigerant generator 20 and a refrigerant sender 50. The refrigerant generator 20 is a part that produces the refrigerant W. The refrigerant sender 50 is a part that transfers the generated refrigerant W toward the cooling target. The refrigerant W sent to the cooling target, i.e., the light modulation units 4R, 4G, 4B in the embodiment by the refrigerant sender 50 is vaporized, and thereby, heat may be removed from the cooling target and the cooling apparatus 10 may cool the cooling target. As below, the respective parts will be explained in detail.

Figure 3:
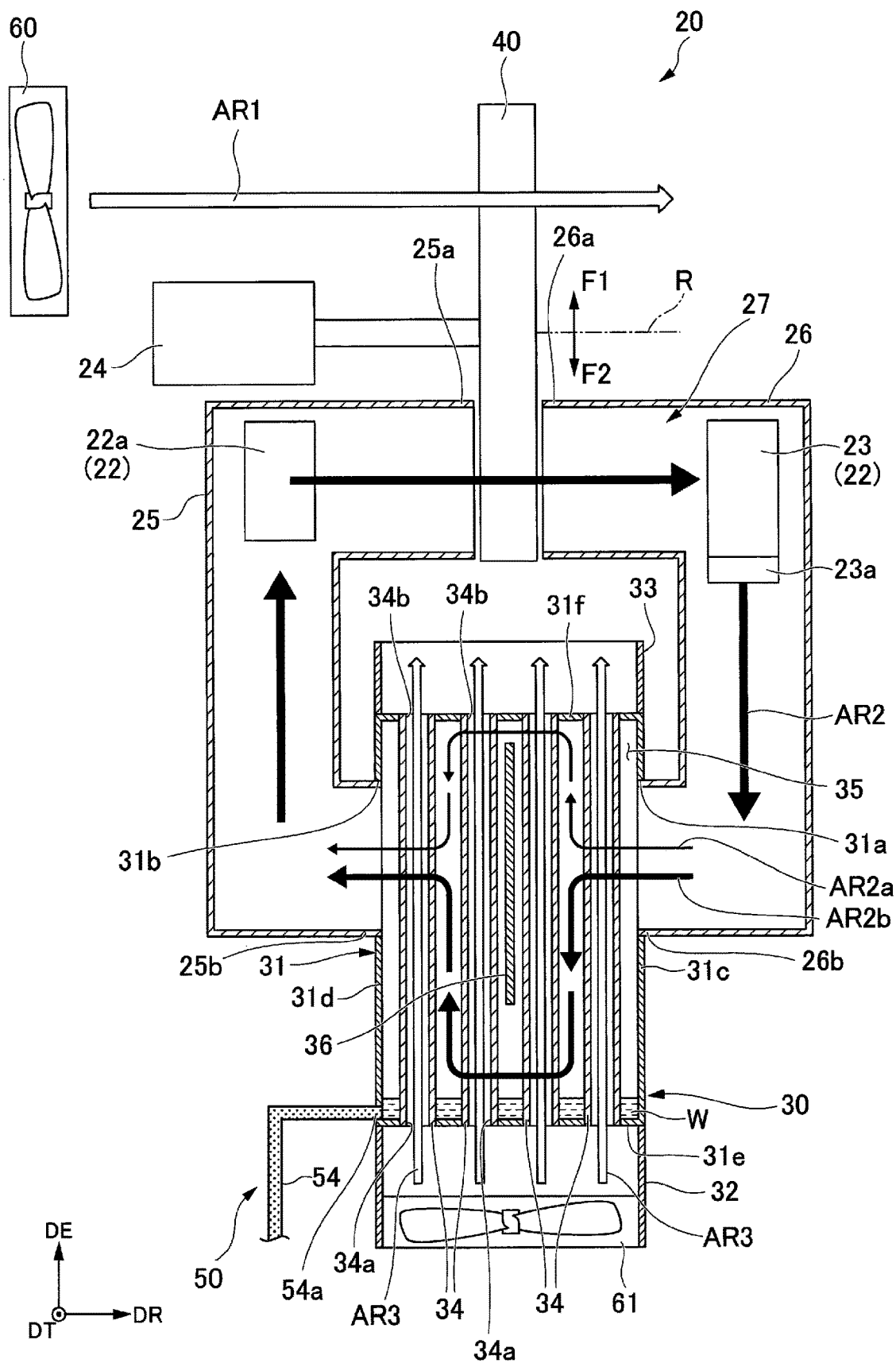
FIG. 3 is a schematic configuration diagram schematically showing a refrigerant generator of the first embodiment.

FIG. 3 is the schematic configuration diagram schematically showing the refrigerant generator 20 of the embodiment. As shown in FIG. 3, the refrigerant generator 20 has a moisture absorbing and desorbing member 40, a motor (driver) 24, a first blower (cooling blower) 60, a heat exchanger 30, a circulation duct 25, a circulation duct 26, a heater 22, a second blower 23, and a third blower 61.

Figure 4:
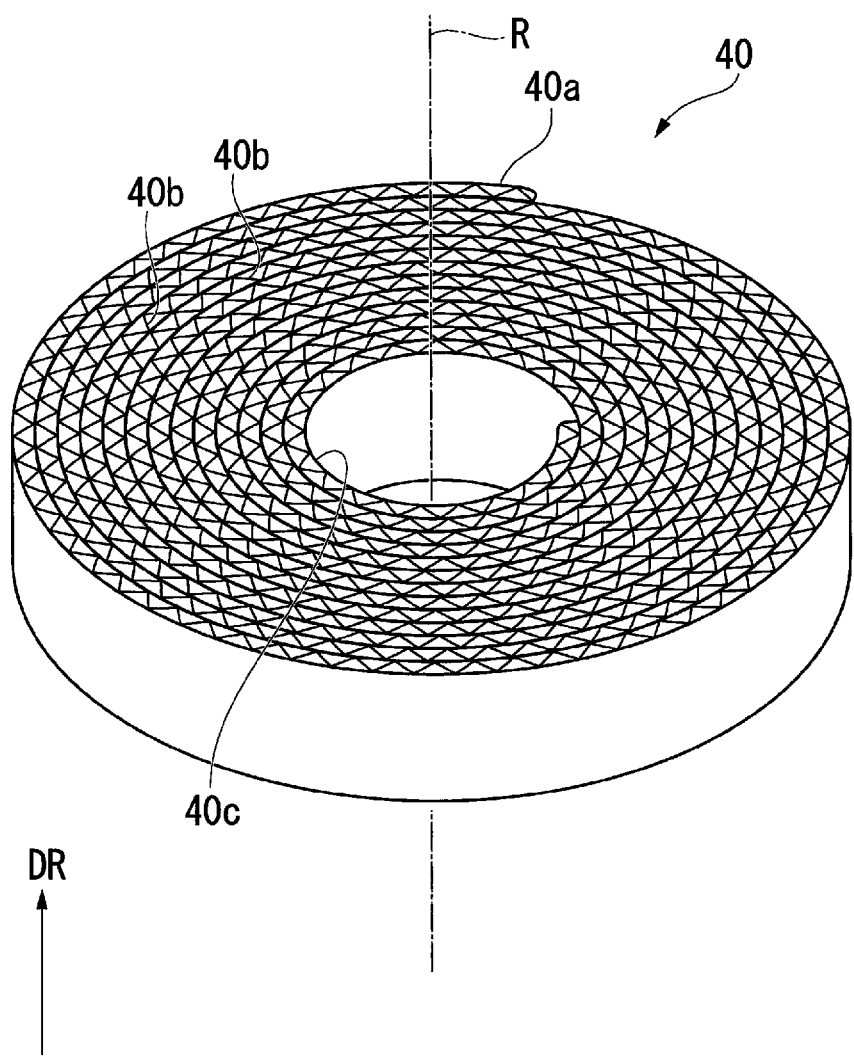
FIG. 4 is a perspective view showing a moisture absorbing and desorbing member of the first embodiment.

FIG. 4 is the perspective view showing the moisture absorbing and desorbing member 40. As shown in FIG. 4, the moisture absorbing and desorbing member 40 has a flat cylindrical shape around a rotation axis R. At the center of the moisture absorbing and desorbing member 40, a center hole 40c around the rotation axis R is formed. The center hole 40c penetrates the moisture absorbing and desorbing member 40 in the axial direction of the rotation axis R. The moisture absorbing and desorbing member 40 rotates about the rotation axis R. In the following description, the axial direction of the rotation axis R is referred to as "rotation axis direction DR" and appropriately shown by a DR axis in the drawings.

The moisture absorbing and desorbing member 40 has a plurality of through holes 40b penetrating the moisture absorbing and desorbing member 40 in the rotation axis direction DR. The moisture absorbing and desorbing member 40 is a porous member. The moisture absorbing and desorbing member 40 has a moisture absorbing and desorbing property. In the embodiment, for example, the moisture absorbing and desorbing member 40 is formed by wrapping of a belt-like member 40a having the through holes 40b around the rotation axis R and application of a material having a moisture absorbing and desorbing property to surfaces exposed to the outside in the wrapped belt-like member 40a. The surfaces exposed to the outside in the wrapped belt-like member 40a include the outer surfaces of the moisture absorbing and desorbing member 40, the inner circumference surface of the center hole 40c, and the inner side surfaces of the through holes 40b. Note that the moisture absorbing and desorbing member 40 as a whole may be formed from a material having a moisture absorbing and desorbing property. The material having the moisture absorbing and desorbing property includes e.g. zeolite and silica gel.

The output shaft of the motor 24 shown in FIG. 3 is inserted and fixed into the center hole 40c of the moisture absorbing and desorbing member 40. The motor 24 rotates the moisture absorbing and desorbing member 40 about the rotation axis R. The rotation speed of the moisture absorbing and desorbing member 40 rotated by the motor 24 is e.g. from 0.2 rpm to 5 rpm.

The first blower 60 is e.g. a suction fan that takes the outside air into the projector 1. The first blower 60 sends air AR1 to a part of the moisture absorbing and desorbing member 40 located in a first region F1. The first region F1 is a region at one side of the rotation axis R in a direction orthogonal to the rotation axis R. On the other hand, a region at the other side of the rotation axis R in the direction orthogonal to the rotation axis R, i.e., a region at the opposite side to the first region F1 with respect to the rotation axis R is a second region F2. The first region F1 is an upper region than the rotation axis R in FIG. 3. The second region F2 is a lower region than the rotation axis R in FIG. 3.

As shown in FIG. 2, the first blower 60 also sends the air AR1 to the light modulation units 4R, 4G, 4B as the cooling target. That is, in the embodiment, the first blower 60 is the cooling blower that sends the air AR1 to the cooling target. The first blower 60 is not particularly limited as long as the device may send the air AR1, but may be e.g. an axial fan or centrifugal fan.

Figure 5:
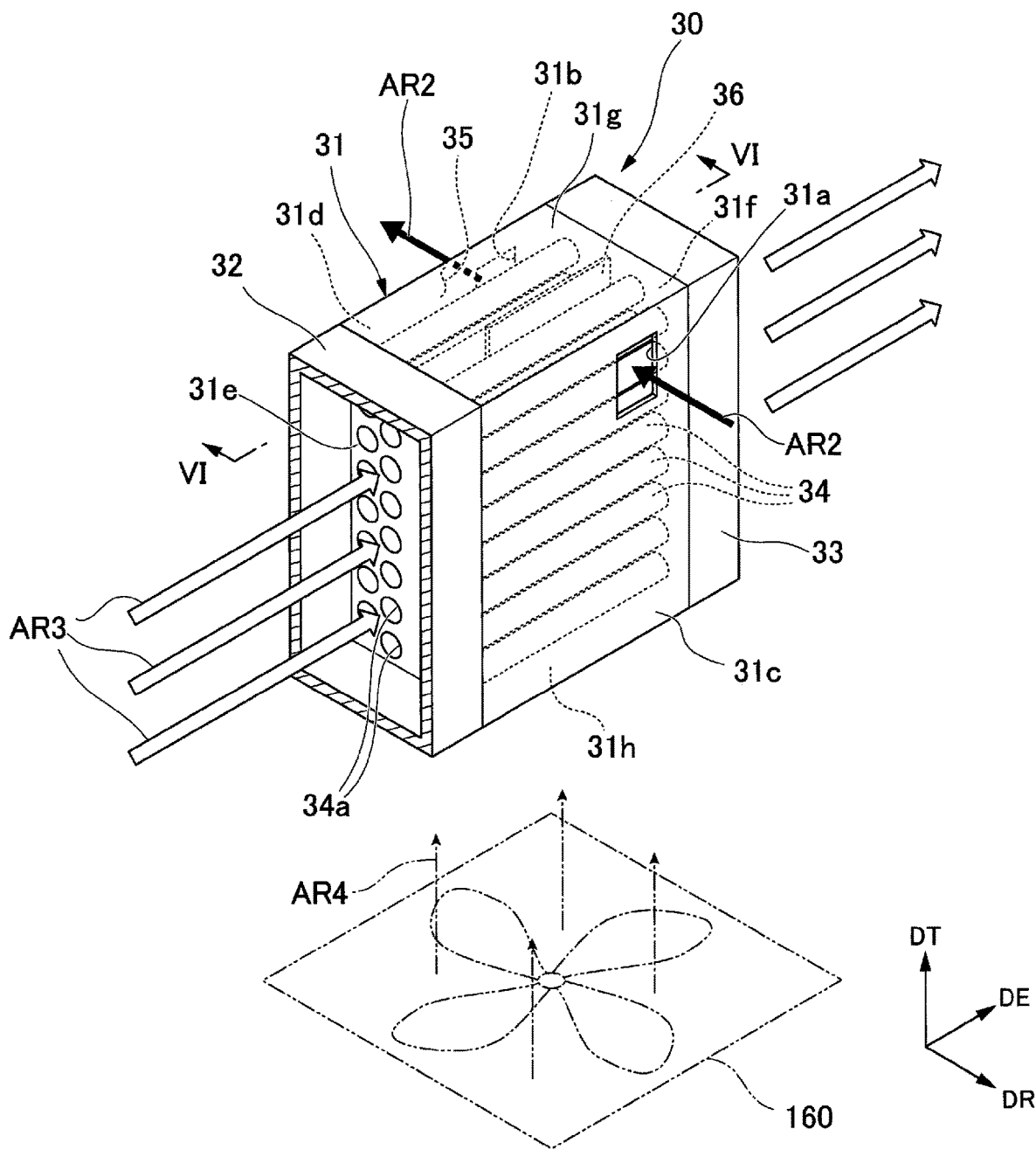
FIG. 5 is a partially sectional perspective view showing a heat exchanger of the first embodiment.
Figure 6:
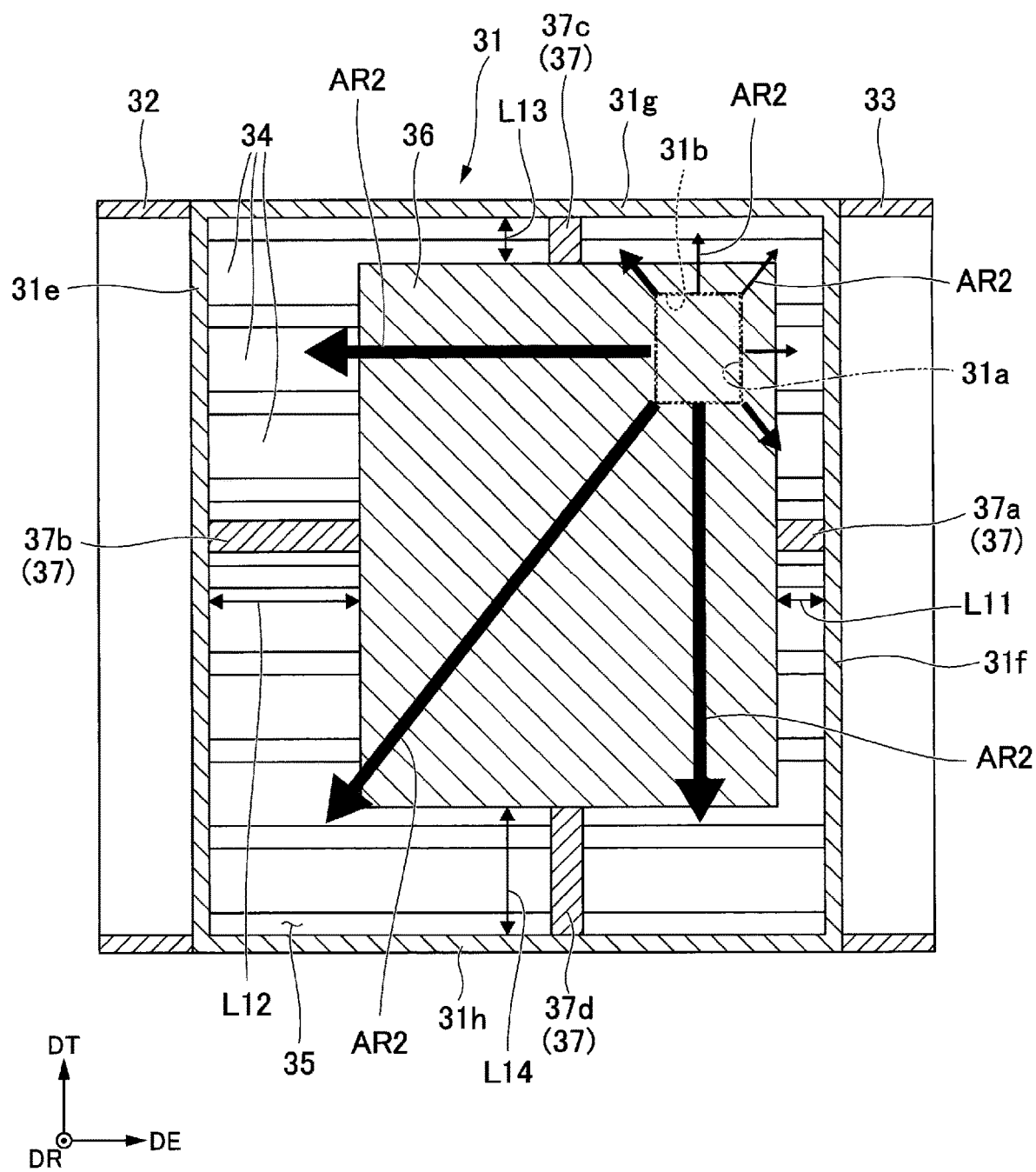
FIG. 6 is a sectional view showing the heat exchanger of the first embodiment along VI-VI in FIG. 5.

The heat exchanger 30 is a part in which the refrigerant W is produced. FIG. 5 is the partially sectional perspective view showing the heat exchanger 30. FIG. 6 is the sectional view showing the heat exchanger 30 along VI-VI in FIG. 5. As shown in FIGS. 5 and 6, the heat exchanger 30 has a housing 31, a plurality of channel portions (heat absorbing portions) 34, an inflow duct 32, an outflow duct 33, and an air guide portion 36.

As shown in FIG. 5, in the embodiment, the housing 31 has a rectangular parallelepiped box shape. The housing 31 has an internal space 35, an inlet port 31a, and an outlet port 31b. Further, the housing 31 includes a plurality of side wall portions. The side wall portions forming the housing 31 in the embodiment include six side wall portions 31c, 31d, 31e, 31f, 31g, 31h. The air sent by the second blower 23 flows into the internal space 35. The inlet port 31a is provided in the side wall portion (first side wall portion) 31c at one side (+DR side) in the rotation axis direction DR of the plurality of side wall portions. The outlet port 31b is provided in the side wall portion (second side wall portion) 31d at the other side (−DR side) in the rotation axis direction DR of the plurality of side wall portions. The inlet port 31a and the outlet port 31b are connected to the internal space 35.

The shape of the inlet port 31a and the shape of the outlet port 31b are the same, for example. The inlet port 31a and the outlet port 31b have e.g. rectangular shapes. The opening area of the inlet port 31a and the opening area of the outlet port 31b are the same, for example. In the embodiment, the inlet port 31a and the outlet port 31b overlap each other as seen along the rotation axis direction DR.

In the embodiment, the inlet port 31a is provided in apart closer to one side (+DE side) in an extension direction DE orthogonal to the rotation axis direction DR in the side wall portion 31c. Similarly, the outlet port 31b is provided in a part closer to the one side (+DE side) in the extension direction DE orthogonal to the rotation axis direction DR in the side wall portion 31d. The extension direction DE is a direction in which the channel portions 34 extend and appropriately shown by a DE axis in the drawings. The above described first region F1 and second region F2 are divided with reference to the rotation axis R in the extension direction DE orthogonal to the rotation axis direction DR.

In the embodiment, the inlet port 31a is provided in a part closer to one side (+DT side) in a height direction DT orthogonal to both the rotation axis direction DR and the extension direction DE in the side wall portion 31c. Similarly, the outlet port 31b is provided in a part closer to the one side (+DT side) in the height direction DT orthogonal to both the rotation axis direction DR and the extension direction DE in the side wall portion 31d. The height direction DT is appropriately shown by a DT axis in the drawings.

Note that, in the embodiment, the rotation axis direction DR corresponds to a first direction. The one side in the rotation axis direction DR corresponds to one side in the first direction and the other side in the rotation axis direction DR corresponds to the other side in the first direction. In the embodiment, the extension direction DE corresponds to a second direction. The one side in the extension direction DE corresponds to one side in the second direction and the other side in the extension direction DE corresponds to the other side in the second direction. In the embodiment, the height direction DT corresponds to a third direction. The one side in the height direction DT corresponds to one side in the third direction and the other side in the height direction DT corresponds to the other side in the third direction.

Note that, in this specification, "an object is provided in a part closer to one side in a predetermined direction in another object" may be a case where a center of an object provided in another object in a predetermined direction is located with shift toward one side in the predetermined direction with respect to the center of the other object in the predetermined direction. For example, "the inlet port 31a is provided in the part closer to the one side in the extension direction DE in the side wall portion 31c" may be a case where the center in the extension direction DE of the inlet port 31a provided in the side wall portion 31c of the housing 31 is located with shift toward the one side in the extension direction DE with respect to the center in the extension direction DE of the side wall portion 31c.

The air flowing into the internal space 35 passes through the inlet port 31a. In the embodiment, the inflow direction in which the air flows into the internal space 35 from the inlet port 31a is a direction parallel to the rotation axis direction DR. The air is entered into the internal space 35 via the inlet port 31a from the one side (+DR side) in the rotation axis direction DR to the other side (−DR side) in the rotation axis direction DR.

The air exhausted from the internal space 35 passes through the outlet port 31b. In the embodiment, the exhaust direction in which the air in the internal space 35 is exhausted from the outlet port 31b is a direction parallel to the rotation axis direction DR. The air is exhausted from the internal space 35 via the outlet port 31b from the one side (+DR side) in the rotation axis direction DR to the other side (−DR side) in the rotation axis direction DR.

The plurality of channel portions 34 are placed within the internal space 35. The air sent by the third blower 61, which will be described later, circulates within the plurality of channel portions 34. In the embodiment, the plurality of channel portions 34 are guide tubes linearly extending in the extension direction DE. The channel portions 34 have e.g. cylindrical shapes. The channel portions 34 open at both sides in the extension direction DE. The plurality of channel portions 34 extend in directions parallel to one another, for example.

Note that, in this specification, "a plurality of channel portions extend in directions parallel to one another" includes a case where the plurality of channel portions extend in substantially parallel directions in addition to the case where the plurality of channel portions extend in directions strictly parallel to one another. "The plurality of channel portions extend in substantially parallel directions" includes e.g. a case where angles formed by the channel portions are within about 10°.

In the embodiment, a plurality of rows in which pluralities of channel portions are arranged in the height direction DT are provided along the rotation axis direction DR. For example, the plurality of channel portions 34 form four rows arranged in the rotation axis direction DR. The channel portions 34 contained in one row of the adjacent rows in the rotation axis direction DR are located between the channel portions 34 contained in the other row in the height direction DT. That is, the plurality of channel portions 34 are placed in a staggered manner as seen along the extension direction DE.

As shown in FIG. 3, the channel portions 34 extend from the side wall portion 31e at the other side (−DE side) in the extension direction DE of the plurality of side wall portions of the housing 31 to the side wall portion 31f at the one side (+DE side) in the extension direction DE of the housing 31.

The ends at the other side (−DE side) in the extension direction DE of the channel portions 34 are first openings 34a opening in the surfaces at the other side in the extension direction DE in the side wall portion 31e and opening to the outside of the housing 31. The ends at the one side (+DE side) in the extension direction DE of the channel portions 34 are second openings 34b opening in the surfaces at the one side in the extension direction DE in the side wall portion 31f and opening to the outside of the housing 31. Thereby, the channel portions 34 connect the spaces located at both sides in the extension direction DE of the housing 31. On the other hand, the inner parts of the plurality of channel portions 34 are not connected to the internal space 35. Thereby, the air circulating within the plurality of channel portions 34 and the air flowing into the internal space 35 are not mixed. That is, the inner parts of the plurality of channel portions 34 are isolated from the internal space 35.

The inflow duct 32 and the outflow duct 33 are ducts extending in the extension direction DE. In the embodiment, the inflow duct 32 and the outflow duct 33 have rectangular tube shapes. The inflow duct 32 and the outflow duct 33 are placed with the housing 31 in between in the extension direction DE and respectively coupled to the housing 31. The inflow duct 32 is located at the other side (−DE side) in the extension direction DE of the housing 31. The outflow duct 33 is located at the one side (+DE side) in the extension direction DE of the housing 31.

The end portion at the one side (+DE side) in the extension direction DE of the inflow duct 32 is fixed to the outer peripheral edge of the side wall portion 31e and closed by the side wall portion 31e. Inside of the inflow duct 32, the first openings 34a of the plurality of channel portions 34 open. Thereby, the inside of the inflow duct 32 is connected to the inner parts of the plurality of channel portions 34 via the first openings 34a.

The end portion at the other side (−DE side) in the extension direction DE of the outflow duct 33 is fixed to the outer peripheral edge of the side wall portion 31f and closed by the side wall portion 31f. Inside of the outflow duct 33, the second openings 34b of the plurality of channel portions 34 open. Thereby, the inside of the outflow duct 33 is connected to the inner parts of the plurality of channel portions 34 via the second openings 34b.

The air guide portion 36 is provided in the internal space 35. The air guide portion 36 is a part that guides the air flowing into the internal space 35. In the embodiment, as shown in FIGS. 3, 5, and 6, the air guide portion 36 has a plate shape with the plate surface facing the rotation axis direction DR. More specifically, the air guide portion 36 has a rectangular plate shape elongated in the height direction DT. The plate surface of the air guide portion 36 is e.g. a flat surface orthogonal to the rotation axis direction DR. The material of the air guide portion 36 is not particularly limited. The air guide portion 36 may be formed using e.g. a metal or resin.

As shown in FIGS. 3 and 5, in the embodiment, the air guide portion 36 is located between the inlet port 31a and the outlet port 31b. More specifically, the air guide portion 36 is located between the inlet port 31a and the outlet port 31b in the rotation axis direction DR. As shown in FIG. 6, the whole inlet port 31a and the whole outlet port 31b are superimposed on the air guide portion 36 as seen along the rotation axis direction DR. As shown in FIGS. 3 and 5, the air guide portion 36 is located at the center of the internal space 35 in the rotation axis direction DR. For example, the air guide portion 36 is located between the two rows at the center in the rotation axis direction DR of the four rows formed by the above described plurality of channel portions 34.

Note that, in this specification, "the air guide portion is located between the inlet port and the outlet port" may be a case where at least a part of the air guide portion is located on an imaginary line connecting the inlet port and the outlet port.

As shown in FIG. 6, in the embodiment, the air guide portion 36 is placed closer to the one side (+DE side) in the extension direction DE and closer to the one side (+DT side) in the height direction DT in the internal space 35. In the embodiment, the air guide portion 36 is placed apart from the inner wall surfaces of the housing 31. Gaps are respectively provided between the respective sides of the air guide portion 36 in the rectangular plate shape and the internal wall surfaces of the housing 31.

A distance L12 between the side wall portion (third side wall portion) 31e at the other side (31 DE side) in the extension direction DE of the plurality of side wall portions forming the housing 31 and the air guide portion 36 is larger than a distance L11 between the side wall portion (fourth side wall portion) 31f at the one side (+DE side) in the extension direction DE of the plurality of side wall portions and the air guide portion 36. The distance L11 corresponds to the dimension of the gap between the edge at the one side in the extension direction DE of the air guide portion 36 and the side wall portion 31f along the extension direction DE. The distance L12 corresponds to the dimension of the gap between the edge at the other side in the extension direction DE of the air guide portion 36 and the side wall portion 31e along the extension direction DE. For example, the distance L12 is equal to or larger than twice the distance L11.

A distance L14 between the side wall portion (fifth side wall portion) 31h at the other side (−DT side) in the height direction DT of the plurality of side wall portions and the air guide portion 36 is larger than a distance L13 between the side wall portion (sixth side wall portion) 31g at the one side (+DT side) in the height direction DT of the plurality of side wall portions and the air guide portion 36. The distance L13 corresponds to the dimension of the gap between the edge at the one side in the height direction DT of the air guide portion 36 and the side wall portion 31g along the height direction DT. The distance L14 corresponds to the dimension of the gap between the edge at the other side in the height direction DT of the air guide portion 36 and the side wall portion 31h along the height direction DT. For example, the distance L14 is equal to or larger than twice the distance L13.

Fixing portions 37 are parts that connect the air guide portion 36 and the inner wall surfaces of the housing 31 and fix the air guide portion 36 to the housing 31. The fixing portion 37 has e.g. a rod shape. Note that the fixing portion 37 may have a plate shape. The fixing method of the fixing portions 37 and the air guide portion 36 and the fixing method of the fixing portions 37 and the housing 31 are not particularly limited, but may be screwing or bonding using adhesives.

In the embodiment, the fixing portions 37 include four fixing portions 37a, 37b, 37c, 37d. The fixing portion 37a connects and fixes the edge at the one side (+DE side) in the extension direction DE of the air guide portion 36 and the side wall portion 31f. The fixing portion 37b connects and fixes the edge at the other side (−DE side) in the extension direction DE of the air guide portion 36 and the side wall portion 31e. The fixing portion 37c connects and fixes the edge at the one side (+DT side) in the height direction DT of the air guide portion 36 and the side wall portion 31g. The fixing portion 37d connects and fixes the edge at the other side (−DT side) in the height direction DT of the air guide portion 36 and the side wall portion 31h. The respective fixing portions 37a, 37b, 37c, 37d connect and fix the center parts of the respective edges of the air guide portion 36 and the inner wall surfaces of the housing 31.

As shown in FIG. 3, the circulation duct 26 is a duct placed at the one side (+DR side) of the moisture absorbing and desorbing member 40 in the rotation axis direction DR. The circulation duct 26 extends from the one side in the rotation axis direction DR of the moisture absorbing and desorbing member 40 to the one side in the rotation axis direction DR of the housing 31. One end portion 26a of the circulation duct 26 opens at the other side (−DR side) in the rotation axis direction DR toward the part of the moisture absorbing and desorbing member 40 located in the second region F2. Another end portion 26b of the circulation duct 26 is coupled to the inlet port 31a of the housing 31 and opens in the internal space 35. Thereby, the inside of the circulation duct 26 is connected to the internal space 35.

The circulation duct 25 is a duct placed at the other side (−DR side) of the moisture absorbing and desorbing member 40 in the rotation axis direction DR. The circulation duct 25 extends from the other side in the rotation axis direction DR of the moisture absorbing and desorbing member 40 to the other side in the rotation axis direction DR of the housing 31. One end portion 25a of the circulation duct 25 opens at the one side (+DR side) in the rotation axis direction DR toward the part of the moisture absorbing and desorbing member 40 located in the second region F2. Another end portion 25b of the circulation duct 25 is coupled to the outlet port 31b of the housing 31 and opens in the internal space 35. Thereby, the inside of the circulation duct 25 is connected to the internal space 35.

The heater 22 has a heating main body portion 22a. The heating main body portion 22a is placed inside of the circulation duct 25. The heating main body portion 22a is placed at the other side (−DR side) of the part of the part of the moisture absorbing and desorbing member 40 located in the second region F2 in the rotation axis direction DR. The heating main body portion 22a is e.g. an electrical heater. The heating main body portion 22a heats the atmosphere (air) within the circulation duct 25. In the embodiment, the heater 22 has the second blower 23.

The second blower 23 is placed inside of the circulation duct 26. The second blower 23 is placed at the one side (+DR side) of the part of the part of the moisture absorbing and desorbing member 40 located in the second region F2 in the rotation axis direction DR. The second blower 23 is e.g. a centrifugal fan. The second blower 23 releases the air suctioned from the other side (−DR side) in the rotation axis direction DR to the other side (−DE side) in the extension direction DE from an exhaust port 23a. The air released from the exhaust port 23a flows into the internal space 35 of the housing 31 via the inlet port 31a. That is, the second blower 23 sends the air into the internal space 35 via the inlet port 31a. Note that the second blower 23 may be e.g. an axial fan.

The air released from the second blower 23 into the internal space 35 is the air suctioned from the other side (−DR side) in the rotation axis direction DR of the second blower 23 via the one end portion 26a of the circulation duct 26 and passing through the part of the moisture absorbing and desorbing member 40 located in the second region F2. That is, the second blower 23 passes the air through the part of the moisture absorbing and desorbing member 40 located in the second region F2 different from the first region F1 and sends the air to the heat exchanger 30. In the embodiment, the air before passing through the part of the moisture absorbing and desorbing member 40 located in the second region F2 flows within the circulation duct 25. Accordingly, the heating main body portion 22a heats the air before passing through the part of the moisture absorbing and desorbing member 40 located in the second region F2.

As described above, in the embodiment, the heater 22 sends the air heated by the heating main body portion 22a to the part of the moisture absorbing and desorbing member 40 located in the second region F2 using the second blower 23, and heats the part of the moisture absorbing and desorbing member 40 located in the second region F2. Thereby, the second blower 23 sends the air around the part heated by the heater 22 in the moisture absorbing and desorbing member 40 to the heat exchanger 30.

The air flowing into the internal space 35 of the heat exchanger 30 from the second blower 23 flows through the internal space 35 while being guided by the air guide portion 36 and flows into the circulation duct 25 via the outlet port 31b. The air flowing into the circulation duct 25 is heated by the heating main body portion 22a, passes through the part of the moisture absorbing and desorbing member 40 located in the second region F2, flows into the circulation duct 26, and is suctioned by the second blower 23.

As described above, in the embodiment, the refrigerant generator 20 has a circulation path 27 in which the air released from the second blower 23 circulates. The circulation path 27 includes at least the circulation ducts 25, 26 and the heat exchanger 30. The circulation path 27 passes through the heating main body portion 22a, the moisture absorbing and desorbing member 40, and the internal space 35. Slight gaps are provided between the moisture absorbing and desorbing member 40 and the circulation ducts 25, 26, however, the circulation path 27 is substantially air-tightly sealed and the flow of the air from outside into the circulation path 27 may be suppressed. Note that, in the following description, the air released from the second blower 23 and circulating within the circulation path 27 will be referred to as "air AR2".

In the embodiment, the third blower 61 is placed inside of the inflow duct 32. The third blower 61 may be an axial fan or centrifugal fan. The third blower 61 releases cooling air AR3 to the one side (+DE side) in the extension direction DE within the inflow duct 32. The released cooling air AR3 flows into the channel portions 34 via the first openings 34a. That is, in the embodiment, the third blower 61 sends the cooling air AR3 into the plurality of channel portions 34 from the first openings 34a via the inflow duct 32. Thereby, the cooling air AR3 circulates within the plurality of channel portions 34. The cooling air AR3 passing through the channel portions 34 cools the air AR2 in the internal space 35 via the channel portions 34. As described above, the third blower 61 sends the cooling air AR3 into the channel portions 34, and thereby, may cool the air AR2 flowing into the internal space 35 via the channel portions 34. The cooling air AR3 sent into the channel portions 34 flows out into the outflow duct 33 from the second openings 34b.

When the air AR1 is sent from the first blower 60 to the part of the moisture absorbing and desorbing member 40 located in the first region F1, the vapor contained in the air AR1 is absorbed by the part of the moisture absorbing and desorbing member 40 located in the first region F1. The part of the moisture absorbing and desorbing member 40 absorbing the vapor moves from the first region F1 to the second region F2 when the moisture absorbing and desorbing member 40 is rotated by the motor 24. Then, the air AR2 at the higher temperature heated by the heating main body portion 22a passes through the part of the moisture absorbing and desorbing member 40 located in the second region F2. Thereby, the moisture absorbed by the moisture absorbing and desorbing member 40 is vaporized released into the air AR2.

The air AR2 containing the vapor absorbed from the air AR1 after passing through the moisture absorbing and desorbing member 40 is sent to the internal space 35 of the heat exchanger 30 by the second blower 23. The air AR2 at the higher temperature sent into the internal space 35 contacts the surfaces of the plurality of channel portions 34 in the internal space 35 and cooled by the cooling air AR3 passing through the plurality of channel portions 34. Thereby, the vapor contained in the air AR2 is condensed into water in the liquid form, i.e., the refrigerant W. That is, in the embodiment, the channel portions 34 correspond to heat absorbing portions that remove heat from the air AR2 in the internal space 35 and produce the refrigerant W. As described above, within the housing 31 of the heat exchanger 30, i.e., in the internal space 35, the air AR2 flowing into the internal space 35 is cooled by the cooling air AR3 sent into the plurality of channel portions 34, and thereby, the refrigerant W is produced from the air AR2 flowing into the internal space 35.

In the embodiment, the refrigerant sender 50 is formed using a porous member and transfers the refrigerant W by capillary action. The material of the refrigerant sender 50 includes e.g. polypropylene, cotton, and porous metal. As the material of the refrigerant sender 50, a material that may provide larger surface tension to the refrigerant sender 50 is preferable.

Figure 7:
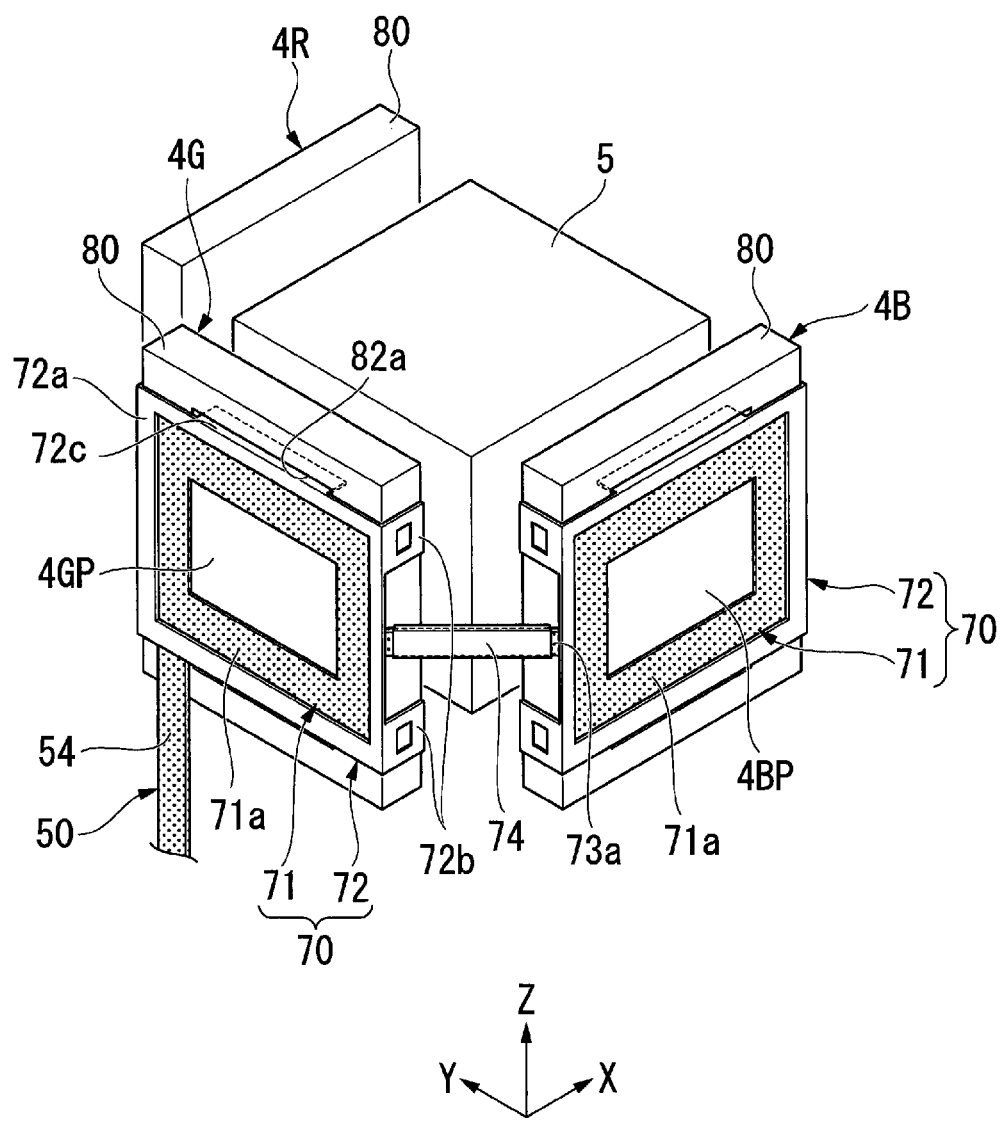
FIG. 7 is a perspective view showing light modulation units and a light combining system of the first embodiment.

The refrigerant sender 50 has a coupling part 54 coupled to the housing 31. The coupling part 54 is a part coupling the housing 31 and the cooling target. As descried above, in the embodiment, the refrigerant sender 50 is formed using the porous member, and thus, the coupling part 54 is formed by the porous member. An end portion 54a coupled to the housing 31 in the coupling part 54 is exposed in the internal space 35. The coupling part 54 projects through the side wall portion 31d of the housing 31 to the outside of the housing 31 from the internal space 35 of the housing 31. The coupling part 54 is a thin belt shape. As shown in FIG. 7, the coupling part 54 projecting to the outside of the housing 31 extends to the light modulation unit 4G as the cooling target. FIG. 7 is the perspective view showing the light modulation units 4R, 4G, 4B and the light combining system 5.

Next, the light modulation units 4R, 4G, 4B as the cooling target in the embodiment will be explained in more detail. In the following description, upward and downward directions Z in which the positive side is the upside and the negative side is the downside are appropriately shown by a Z-axis in the drawings. Directions parallel to an optical axis AX of the projection lens closest to the light exiting side in the projection optical device 6, i.e., directions parallel to the projection direction of the projection optical device are referred to as "optical axis directions X" and appropriately shown by an X-axis in the drawings. The optical axis directions X are orthogonal to the upward and downward directions Z. Further, directions orthogonal to both the optical axis directions X and the upward and downward directions Z are referred to as "width directions Y" and appropriately shown by a Y-axis in the drawings.

Note that the upward and downward directions Z and the upside and the downside are simply the names for explanation of the relative position relationship among the respective parts, and the real placement relationship etc. may be another placement relationship etc. than the placement relationship etc. shown by these names.

Figure 8:
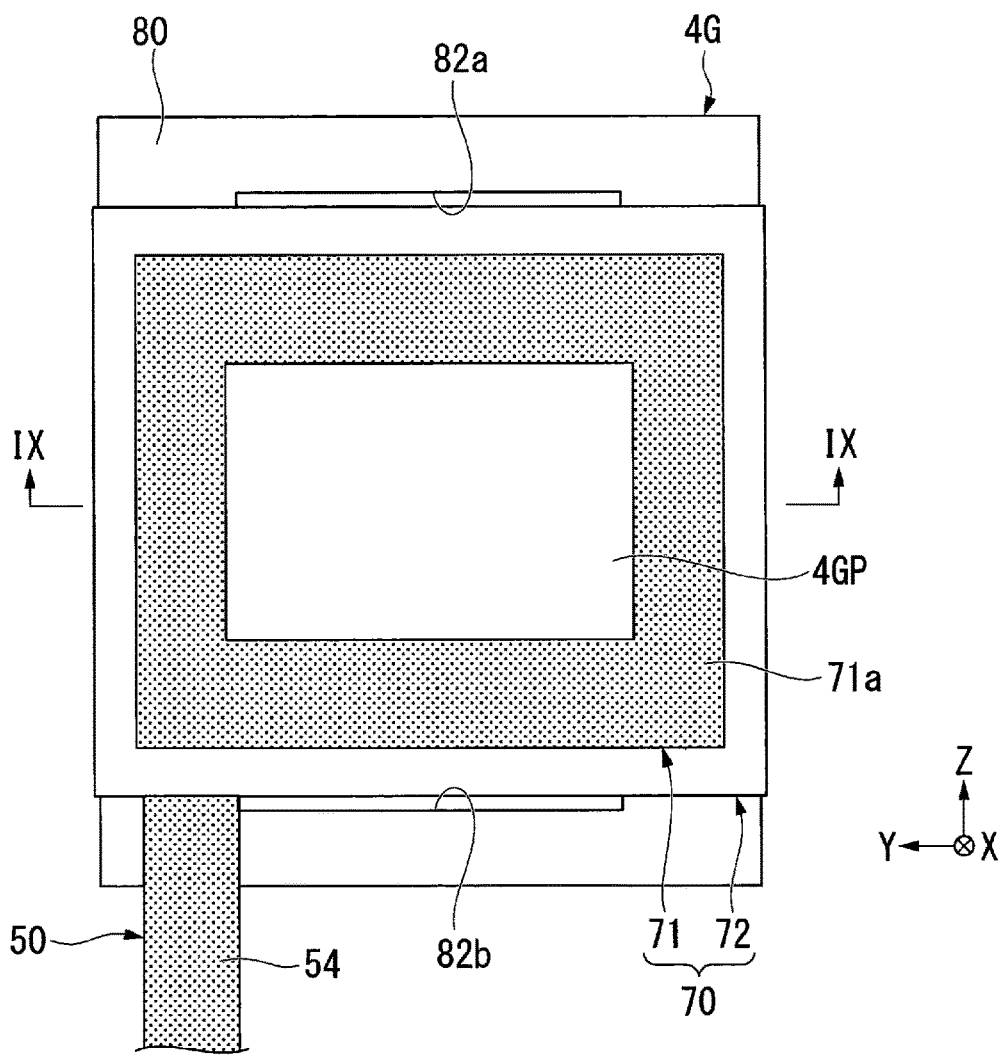
FIG. 8 shows the light modulation unit of the first embodiment as seen from a light incident side.
Figure 9:
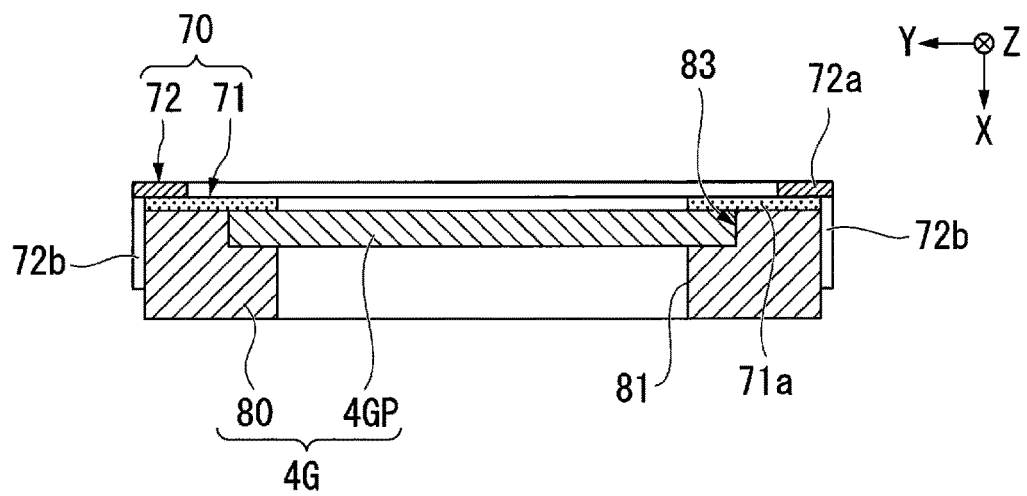
FIG. 9 is a sectional view showing the light modulation unit of the first embodiment along IX-IX in FIG. 8.

FIG. 8 shows the light modulation unit 4G as seen from the light incident side. FIG. 9 is the sectional view showing the light modulation unit 4G along IX-IX in FIG. 8.

The light modulation unit 4R, the light modulation unit 4G, and the light modulation unit 4B as the cooling target are placed to surround the light combining system 5 as shown in FIG. 7. The light modulation unit 4R and the light modulation unit 4B are placed at sides opposite to each other with the light combining system 5 in between in the width directions Y. The light modulation unit 4G is placed at the light incident side (−X side) in the optical axis directions X of the light combining system 5. The structure of the light modulation unit 4R, the structure of the light modulation unit 4G, and the structure of the light modulation unit 4B are the same except that the placement positions and postures are different. In the following description, only the light modulation unit 4G may be representatively explained.

The light modulation unit 4G has a holder frame 80 that holds the light modulator 4GP. As shown in FIGS. 7 to 9, the holder frame 80 has a substantially rectangular parallelepiped shape flat in the direction in which the light enters the light modulator 4GP and elongated in the upward and downward directions Z. The direction in which the light enters the light modulator 4GP is e.g. the optical axis direction X.

As shown in FIG. 9, the holder frame 80 has a through hole 81 penetrating the holder frame 80 in the light incident direction. A step portion 83 in which the width of the through hole 81 is larger is provided at the edge at the light incident side (−X side) of the through hole 81. The light modulator 4GP is fitted in the step portion 83 and held by the holder frame 80. As shown in FIG. 8, insertion grooves 82a, 82b are formed in parts on both sides in the upward and downward directions Z in the surface at the light incident side of the holder frame 80.

As shown in FIGS. 7 to 9, the projector 1 further includes a cooling promoter 70 provided in the light modulation unit 4G as the cooling target. The cooling promoter 70 has a refrigerant holding portion 71 and a fixing member 72. The refrigerant holding portion 71 is attached to the surface of the holder frame 80 of the light modulation unit 4G as the cooling target. In the embodiment, the refrigerant holding portion 71 is provided on the surface at the light incident side (−X side) of the light modulator 4GP in the holder frame 80. The refrigerant holding portion 71 is formed using a porous member that holds the refrigerant W. The material of the refrigerant holding portion 71 includes e.g. polypropylene, cotton, and porous metal. For example, the material of the refrigerant holding portion 71 may be the same as the material of the refrigerant sender 50. As the material of the refrigerant holding portion 71, a material that may provide larger surface tension to the refrigerant holding portion 71 is preferable.

Figure 10:
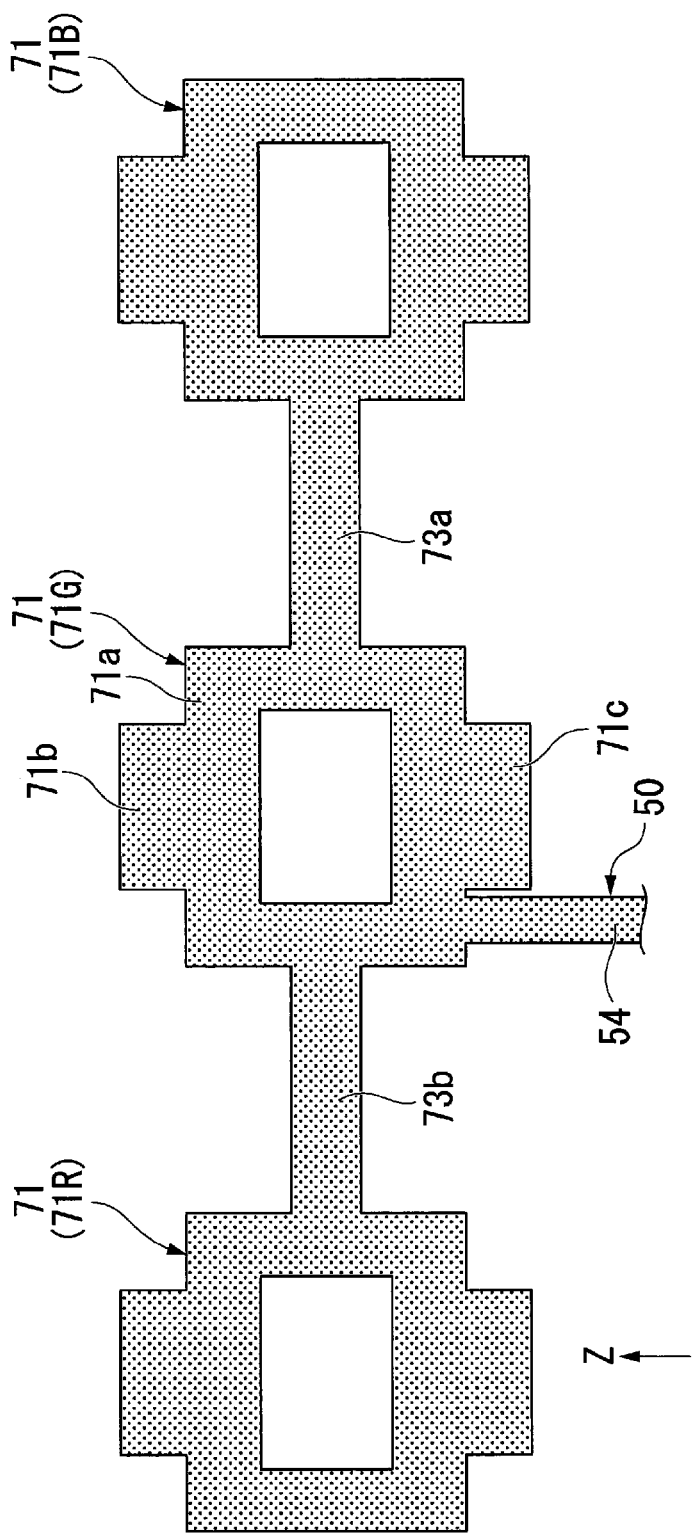
FIG. 10 shows a refrigerant holding portion of the first embodiment.

FIG. 10 shows the refrigerant holding portions 71. As shown in FIG. 10, the refrigerant holding portion 71 has a main body portion 71a having a rectangular frame shape and insertion portions 71b, 71c provided at ends on both sides in the upward and downward directions Z in the main body portion 71a. As shown in FIG. 9, the main body portion 71a covers a part of the surface at the light incident side (−X side) of the light modulator 4GP in the holder frame 80. The part at the inner edge side in the main body portion 71a covers the outer edge part of the light modulator 4GP. The insertion portion 71b is bent and inserted into the insertion groove 82a of the holder frame 80. The insertion portion 71c is bent and inserted into the insertion groove 82b of the holder frame 80.

The fixing member 72 is a member that fixes the refrigerant holding portion 71. As shown in FIGS. 7 and 9, the fixing member 72 is a plate-like member. The fixing member 72 is formed using e.g. a metal. The fixing member 72 has a frame portion 72a having a rectangular frame shape, attachment portions 72b, and insertion portions 72c. As shown in FIGS. 8 and 9, the frame portion 72a covers the outer edge of the refrigerant holding portion 71. The holder frame 80, the refrigerant holding portion 71, and the frame portion 72a overlap in the direction of the light passing through the light modulation unit 4G (optical axis direction X). In the following description, the direction in which the holder frame 80, the refrigerant holding portion 71, and the frame portion 72a overlap will be simply referred to as "overlap direction". The fixing member 72 fixes the refrigerant holding portion 71 between the holder frame 80 and itself in the overlap direction (optical axis direction X) using the frame portion 72a.

The inner edge of the frame portion 72a is provided outside of the inner edge of the refrigerant holding portion 71. Accordingly, a part of the refrigerant holding portion 71, i.e., the part at the inner side than the frame portion 72a in the embodiment is exposed as seen from the fixing member 72 side in the overlap direction.

As shown in FIGS. 7 and 9, the attachment portions 72b are respectively provided at both ends in the width directions Y in both end portions in the upward and downward directions Z of the frame portion 72a. The attachment portions 72b project toward the holder frame 80 side (+X side) from the frame portion 72a. The attachment portions 72b are engaged with protrusions provided on the side surface of the holder frame 80. Thereby, the fixing member 72 is fixed to the holder frame 80.

The insertion portions 72c are provided in both end portions in the upward and downward directions Z of the frame portion 72a. The insertion portions 72c project toward the holder frame 80 side (+X side) from the frame portion 72a. The insertion portions 72c are inserted into the insertion grooves 82a, 82b of the holder frame 80. The insertion portions 72c hold the insertion portions 71b, 71c of the refrigerant holding portion 71 inside of the insertion grooves 82a, 82b.

The cooling promoter 70 is provided in each of the plurality of light modulators 4R, 4G, 4B. That is, the refrigerant holding portion 71 and the fixing member 72 are provided in each of the plurality of light modulators 4R, 4G, 4B. As shown in FIG. 10, the refrigerant holding portion 71G provided in the light modulation unit 4G of the respective light modulators 4R, 4G, 4B is coupled to the refrigerant sender 50. More specifically, the coupling part 54 of the refrigerant sender 50 is coupled to the lower end portion of the refrigerant holding portion 71G.

The refrigerant holding portion 71B attached to the light modulation unit 4B and the refrigerant holding portion 71R attached to the light modulation unit 4R are the same as the refrigerant holding portion 71G attached to the light modulation unit 4G except that the coupling part 54 is not coupled.

In the embodiment, coupling portions 73a, 73b formed using porous members that couple the refrigerant holding portions 71 provided in the plurality of light modulators 4R, 4G, 4B to each other are provided. In the embodiment, the refrigerant holding portion 71B attached to the light modulation unit 4B and the refrigerant holding portion 71R attached to the light modulation unit 4R are coupled to the sides of the refrigerant holding portion 71G attached to the light modulation unit 4G via the coupling portions 73a, 73b.

The coupling portion 73a couples the refrigerant holding portion 71G attached to the light modulation unit 4G and the refrigerant holding portion 71B attached to the light modulation unit 4B. Thereby, the refrigerant holding portion 71B is coupled to the coupling part 54 of the refrigerant sender 50 via the refrigerant holding portion 71G. As shown in FIG. 7, a cover 74 that covers the coupling portion 73a is provided on the coupling portion 73a. The cover 74 is e.g. a resin film or the like.

The coupling portion 73b couples the refrigerant holding portion 71G attached to the light modulation unit 4G and the refrigerant holding portion 71R attached to the light modulation unit 4R. Thereby, the refrigerant holding portion 71R is coupled to the coupling part 54 of the refrigerant sender 50 via the refrigerant holding portion 71G. A cover 74 (not shown) is provided on the coupling portion 73b like the coupling portion 73a.

The refrigerant W produced by the refrigerant generator 20 is transferred to the refrigerant holding portion 71G by the coupling part 54 of the refrigerant sender 50. The refrigerant W transferred to the refrigerant holding portion 71G is transferred to the refrigerant holding portion 71B via the coupling portion 73a and transferred to the refrigerant holding portion 71R via the coupling portion 73b. In this manner, the refrigerant W produced in the refrigerant generator 20 is transferred to the three light modulation units 4R, 4G, 4B. Then, the refrigerant W transferred to and held by the refrigerant holding portions 71 is vaporized, and thereby, the light modulation units 4R, 4G, 4B as the cooling target are cooled. More specifically, the refrigerant W held by the refrigerant holding portions 71 is vaporized and the holder frame 80 with the refrigerant holding portions 71 attached thereto is cooled. The holder frame 80 is cooled and the light modulators 4RP, 4GP, 4BP held by the holder frame 80 are cooled. Thereby, the light modulators 4RP, 4GP, 4BP as the cooling target may be cooled by the cooling apparatus 10.

According to the embodiment, the cooling apparatus 10 may transfer the refrigerant W produced by the refrigerant generator 20 to the cooling target using the refrigerant sender 50 and cool the cooling target by removing heat from the cooling target using vaporization of the refrigerant W as endothermic reaction. The cooling by the vaporization of the refrigerant W may positively remove heat from the cooling target and is better in cooling performance than in a case of cooling of the cooling target by simple heat transfer to the refrigerant like air cooling and liquid cooling. Thereby, when the same cooling performance as that of the air cooling and liquid cooling is obtained, the whole cooling apparatus 10 is easily downsized compared to air cooling and liquid cooling apparatus.

In the case of cooling by vaporization of the refrigerant W, the cooling performance may be improved by increase of the surface area in which the vaporized refrigerant W contacts the cooling target. Accordingly, noise increase may be suppressed even when the cooling performance by the cooling apparatus 10 is increased. As described above, according to the embodiment, the projector 1 including the compact and quiet cooling apparatus 10 having excellent cooling performance may be obtained.

According to the embodiment, the refrigerant W may be produced in the refrigerant generator 20, and thus, it is not necessary for a user to replenish the refrigerant W and the user-friendliness may be improved. Further, production of the refrigerant W when necessary in necessary amount is adjustable, and thus, storage of the refrigerant W in a storage tank or the like is not required and the weight of the projector 1 may be reduced.

According to the embodiment, the vapor contained in the air AR1 sent from the first blower 60 may be absorbed by the moisture absorbing and desorbing member 40 and the moisture absorbed by the moisture absorbing and desorbing member 40 may be released as vapor into the air AR2 sent by the second blower 23. Then, the moisture released as vapor into the air AR2 may be condensed and the refrigerant W may be produced by the heat exchanger 30. Thereby, according to the embodiment, the refrigerant W may be produced out of the atmosphere within the projector 1.

For example, when the air from the second blower is entered into the plurality of channel portions and the refrigerant W is produced within the plurality of channel portions, the channel portions may be clogged by the refrigerant W. Particularly, when the temperature in the environment in which the projector 1 is installed is lower, the refrigerant W may be solidified and clog the channel portions.

On the other hand, according to the embodiment, the refrigerant W is produced in the internal space 35, not in the channel portions 34. Accordingly, no clogging by the produced refrigerant W occurs in the channel portions 34. Further, the refrigerant W is easily collected to one location compared to the case where the refrigerant W is produced within the plurality of channel portions 34. Accordingly, even when the posture of the projector 1 changes or the like, the refrigerant W within the internal space 35 may be easily sent to the cooling target by the refrigerant sender 50.

For example, depending on the positions of the inlet port 31a and the outlet port 31b of the housing 31 or the like, the air AR2 flowing into the internal space 35 may be harder to contact the channel portions 34 as the heat absorbing portions and the amount of production of the refrigerant W may be harder to be sufficiently improved.

On the other hand, according to the embodiment, the air guide portion 36 that guides the air AR2 flowing into the internal space 35 is provided in the internal space 35. Accordingly, the entering air AR2 may be easier to widely spread within the internal space 35 and the entering air AR2 may be easier to sufficiently contact the channel portions 34. Thereby, the air AR2 may be easily cooled via the channel portions 34 and reduction of the amount of production of the refrigerant W may be suppressed. Therefore, according to the embodiment, the refrigerant production efficiency in the refrigerant generator 20 may be improved. Further, the time from entry of the air AR2 into to exhaust from the internal space 35 may be easily extended by the air guide portion 36 and the time of condensation of the vapor contained in the air AR2 may be extended. Accordingly, the refrigerant production efficiency in the refrigerant generator 20 may be further improved.

Furthermore, the refrigerant production efficiency in the refrigerant generator 20 may be improved, and thus, the amount of production of the refrigerant W in the heat exchanger 30 may be maintained with the downsized heat exchanger 30. Thereby, the projector 1 may be downsized.

According to the embodiment, the air guide portion 36 is located between the inlet port 31a and the outlet port 31b. Accordingly, the air AR2 flowing into the internal space 35 from the inlet port 31a easily contacts the air guide portion 36 in the middle toward the outlet port 31b. Thereby, the air AR2 is easily guided by the air guide portion 36 and the entering air AR2 is easily widely spread within the internal space 35. Therefore, the refrigerant production efficiency in the refrigerant generator 20 may be further improved.

In the embodiment, the inlet port 31a is provided in the side wall portion 31c at the one side in the rotation axis direction DR of the plurality of side wall portions forming the housing 31, and the outlet port 31b is provided in the side wall portion 31d at the other side in the rotation axis direction DR of the plurality of side wall portions. Accordingly, without the air guide portion 36, the air AR2 flowing into the internal space 35 passes the internal space 35 in the rotation axis direction DR and is easily exhausted from the outlet port 31b. Thereby, the air AR2 tends to pass only a part of the internal space 35 and the total contact area with the channel portions 34 until the air AR2 is exhausted from the internal space 35 tends to be smaller. Therefore, the air AR2 may be harder to be sufficiently cooled and the amount of production of the refrigerant W may be harder to be sufficiently improved.

On the other hand, according to the embodiment, the air guide portion 36 is placed in the internal space 35, and thus, the air AR2 flowing into the internal space 35 from the inlet port 31a may be easily prevented from moving toward the outlet port 31b in the shortest path by the air guide portion 36. Thereby, the air AR2 may be detoured within the internal space 35 and the air AR2 is easily widely spread within the internal space 35. Therefore, the total contact area with the channel portions 34 until the air AR2 is exhausted from the internal space 35 is easily increased and the refrigerant production efficiency in the refrigerant generator 20 may be further improved.

Note that, in the following description, the total contact area with the channel portions 34 until the air AR2 is exhausted from the internal space 35 may be simply referred to as "the contact area between the air AR2 and the channel portions 34".

In the embodiment, the inlet port 31a and the outlet port 31b overlap each other as seen along the rotation axis direction DR. Accordingly, without the air guide portion 36, the air AR2 flowing into the inlet port 31a moves straight in the rotation axis direction DR and is easily exhausted from the outlet port 31b. Therefore, the contact area between the air AR2 and the channel portions 34 may tend to be even smaller and the amount of production of the refrigerant W may be harder to be improved.

On the other hand, according to the embodiment, the air guide portion 36 is located between the inlet port 31a and the outlet port 31b in the rotation axis direction DR. Accordingly, the air AR2 flowing into the internal space 35 from the inlet port 31a and moving in the rotation axis direction DR contacts the air guide portion 36 and is guided along the air guide portion 36 in the direction orthogonal to the rotation axis direction DR. Thereby, the air AR2 is easily widely spread within the internal space 35. Therefore, the contact area between the air AR2 and the channel portions 34 is easily further increased and the refrigerant production efficiency in the refrigerant generator 20 may be further improved.

In the embodiment, the inlet port 31a is provided in the part closer to the one side in the extension direction DE in the side wall portion 31c, and the outlet port 31b is provided in the part closer to the one side in the extension direction DE in the side wall portion 31d. Accordingly, without the air guide portion 36, the air AR2 is hard to flow in the part closer to the other side in the extension direction DE of the internal space 35.

On the other hand, according to the embodiment, the distance L12 between the side wall portion 31e at the other side in the extension direction DE of the plurality of side wall portions and the air guide portion 36 is larger than the distance L11 between the side wall portion 31f at the one side in the extension direction DE of the plurality of side wall portions and the air guide portion 36. Accordingly, the air AR2 is easier to pass through the gap between the side wall portion 31e and the air guide portion 36 than the gap between the side wall portion 31f and the air guide portion 36. Thereby, as shown in FIGS. 3 to 6, the air AR2 flowing into the internal space 35 from the inlet port 31a flows toward the other side (−DE side) in the extension direction DE in the larger amount than that toward the one side (+DE side) in the extension direction DE. Therefore, the air AR2 is easy to flow in the part closer to the other side in the extension direction DE of the internal space 35 and the air AR2 is easily spread more widely within the internal space 35. Accordingly, the refrigerant production efficiency in the refrigerant generator 20 may be further improved.

In the embodiment, the inlet port 31a is provided in the part closer to the one side in the height direction DT in the side wall portion 31c, and the outlet port 31b is provided in the part closer to the one side in the height direction DT in the side wall portion 31d. Accordingly, without the air guide portion 36, the air AR2 is hard to flow in the part closer to the other side in the height direction DT of the internal space 35.

On the other hand, according to the embodiment, the distance L14 between the side wall portion 31h at the other side in the height direction DT of the plurality of side wall portions and the air guide portion 36 is larger than the distance L13 between the side wall portion 31g at the one side in the height direction DT of the plurality of side wall portions and the air guide portion 36. Accordingly, the air AR2 is easier to pass through the gap between the side wall portion 31h and the air guide portion 36 than the gap between the side wall portion 31g and the air guide portion 36. Thereby, as shown in FIG. 6, the air AR2 flowing into the internal space 35 from the inlet port 31a flows toward the other side (−DT side) in the height direction DT in the larger amount than that toward the one side (+DT side) in the height direction DT. Therefore, the air AR2 is easy to flow in the part closer to the other side in the height direction DT of the internal space 35 and the air AR2 is easily spread more widely within the internal space 35. Accordingly, the refrigerant production efficiency in the refrigerant generator 20 may be further improved.

According to the embodiment, the air guide portion 36 is fixed to the housing 31 by the fixing portions 37 and placed apart from the inner wall surfaces of the housing 31. Accordingly, compared to a case where the air guide portion 36 contacts the inner wall surfaces of the housing 31, the air guide portion 36 is harder to block the refrigerant W moving along the inner wall surfaces of the housing 31. Thereby, even when the air guide portion 36 is provided, the refrigerant W is easily collected to one location within the internal space 35. Therefore, even when the posture of the projector 1 changes or the like, the refrigerant W within the internal space 35 is easily sent to the cooling target by the refrigerant sender 50.

According to the embodiment, the heat absorbing portion placed in the internal space 35 of the housing 31 and removing heat from the air AR2 in the internal space 35 and producing the refrigerant W is the channel portion 34 having the inner part isolated from the internal space 35, and the plurality of the portions are provided. Further, the cooling air AR3 for cooling the air AR2 in the internal space 35 via the channel portions 34 circulates inside of the plurality of channel portions 34. Accordingly, the cooling air AR3 is circulated in the channel portions 34, and thereby, the vapor contained in the air AR2 may be condensed and the refrigerant W may be easily produced in the internal space 35. Here, the air AR2 in the internal space 35 is cooled via the surfaces exposed in the internal space 35 of the plurality of channel portions 34. Accordingly, for example, with the larger number of channel portions 34, the surface area of the channel portions 34 exposed in the internal space 35 may be made larger and the air AR2 may be cooled more easily. Thereby, the refrigerant W is easily produced by condensation of the vapor contained in the air AR2. Therefore, the refrigerant production efficiency in the refrigerant generator 20 may be further improved.

Here, the smaller the outer diameters of the channel portions 34, the larger the number of channel portions 34 that can be placed in the internal space 35. On the other hand, the smaller the outer diameters of the channel portions 34, the smaller the surface area per channel portion 34. However, the number of channel portions 34 that can be placed in the internal space 35 may be made larger and, as a result, the total surface area of the plurality of channel portions 34 is easily made larger. Thereby, the refrigerant production efficiency in the refrigerant generator 20 may be further improved.

The larger the number of channel portions 34 as described above, the smaller the gap between the channel portions 34. In this case, it is considered that the flow of the air AR2 in the internal space 35 is disturbed due to increase of pressure loss generated in the air AR2 passing through the internal space 35, variations of the flow of the air AR2 in the internal space 35, or the like. However, as the time from when the air AR2 flows in to out from the internal space 35 is longer, the time for condensation of the vapor contained in the air AR2 may be made longer. Accordingly, the number of channel portions 34 is increased and the flow of the air AR2 in the internal space 35 is disturbed to some extent, and the refrigerant W may be produced from the air AR2 in the larger amount. Thereby, the refrigerant production efficiency in the refrigerant generator 20 may be further improved.

For example, when the air from the second blower is entered into the plurality of channel portions and the refrigerant W is produced within the plurality of channel portions, the air is sent to the plurality of channel portions from outside, and thereby, the air within the channel portions is cooled. In this case, in the respective plurality of channel portions, air blow from the outside tends to vary. Accordingly, the degree of production of the refrigerant W may vary in each of the channel portions.

On the other hand, according to the embodiment, the air AR2 in the internal space 35 is cooled by the cooling air AR3 flowing in the inner parts of the respective channel portions 34. Accordingly, the channel portions 34 are uniformly placed in the internal space 35 and the whole air AR2 in the internal space 35 is easily uniformly cooled. Thereby, the refrigerant W may be produced more easily in the internal space 35 and the refrigerant production efficiency in the refrigerant generator 20 may be further improved.

The flow rate of the cooling air AR3 flowing within the channel portions 34 is made higher, and thereby, the air AR2 in the internal space 35 may be cooled more easily by the cooling air AR3. On the other hand, when the flow rate of the cooling air AR3 is made higher, noise by the flow of the cooling air AR3 tends to be larger. However, in the embodiment, the cooling air AR3 passes through the channel portions 34 placed in the internal space 35, and thus, the noise by the flow of the cooling air AR3 is harder to leak to the outside of the housing 31. Therefore, the cooling efficiency of the air AR2 in the internal space 35 may be improved by the larger flow rate of the cooling air AR3, and the larger noise generated from the projector 1 may be suppressed.

The channel area in the channel portions 34 is smaller than the channel area of the internal space 35. Accordingly, the flow rate of the cooling air AR3 flowing within the channel portions 34 tends to be higher than the flow rate of the air AR2 flowing within the internal space 35. Thereby, the flow rate of the cooling air AR3 may be easily made larger within the channel portions 34. Therefore, the air AR2 within the internal space 35 may be preferably cooled via the channel portions 34 by the cooling air AR3. Accordingly, the refrigerant production efficiency in the refrigerant generator 20 may be further improved.

On the other hand, the flow rate of the air AR2 flowing within the internal space 35 may be easily made smaller. Accordingly, the retention time of the air AR2 within the internal space 35 may be made longer. Thereby, the time for condensation of the vapor of the air AR2 in the internal space 35 may be made longer and the refrigerant W may be produced from the air AR2 more easily. Therefore, the refrigerant production efficiency in the refrigerant generator 20 may be further improved.

Further, according to the embodiment, the refrigerant generator 20 has the third blower 61 that sends the cooling air AR3 into the plurality of channel portions 34. Accordingly, the cooling air AR3 is easily sent into the plurality of channel portions 34 and the air AR2 within the internal space 35 is easily cooled via the channel portions 34.

According to the embodiment, the third blower 61 sends the cooling air AR3 into the plurality of channel portions 34 from the first openings 34a via the inflow duct 32 in which the first openings 34a of the plurality of channel portions 34 open inside. Accordingly, the cooling air AR3 released from the third blower 61 may be guided into the channel portions 34 by the inflow duct 32. Therefore, the cooling air AR3 is easily sent into the channel portions 34.

According to the embodiment, the end portion 54a of the coupling part 54 of the refrigerant sender 50 is exposed in the internal space 35. Accordingly, the end portion 54a of the coupling part 54 may be brought into contact with the refrigerant W produced in the internal space 35. Further, the coupling part 54 is formed using the porous member. Accordingly, the refrigerant W may be absorbed by the coupling part 54 via the end portion 54a and transferred to the cooling target by capillary action. Thereby, the refrigerant W produced in the internal space 35 may be easily transferred to the cooling target by the refrigerant sender 50. Furthermore, it is not necessary to separately prepare power of a pump or the like for transfer of the refrigerant W. Therefore, increase of the number of components of the projector 1 may be suppressed and the projector 1 may be easily reduced in size and weight.

For example, in the refrigerant generator 20, when the humidity of the air AR2 sent from the second blower 23 to the heat exchanger 30 is lower, the refrigerant W may be harder to be produced though the heat exchanger 30 is cooled. The humidity of the air AR2 sent to the heat exchanger 30 may be lower, for example, when the air outside of the projector 1 or the like is mixed.

On the other hand, according to the embodiment, the refrigerant generator 20 has the circulation path 27 in which the air AR2 released from the second blower 23 circulates. Accordingly, the circulation path 27 is substantially airtightly sealed, and thereby, entry of the air outside of the projector 1 into the circulation path 27 may be suppressed and the humidity of the air AR2 sent to the heat exchanger 30 may be easily maintained to be higher. Therefore, the internal space 35 is cooled via the plurality of channel portions 34, and thereby, the refrigerant W may be preferably produced.

According to the embodiment, the plurality of channel portions 34 extend in the direction (extension direction DE) crossing the direction (rotation axis direction DR) in which the air AR2 flows into the internal space 35. Accordingly, the air AR2 is easily brought into contact with the surfaces of the plurality of channel portions 34 in the internal space 35 and the air AR2 is easily cooled. Thereby, the refrigerant production efficiency in the refrigerant generator 20 may be further improved.

According to the embodiment, the plurality of channel portions 34 are the linearly extending guide tubes. Accordingly, the cooling air AR3 may easily flow in the inner parts of the channel portions 34. Further, the channel portions 34 may be easily formed and the manufacturing cost of the refrigerant generator 20 may be reduced.

According to the embodiment, the plurality of channel portions 34 extend in directions parallel to one another. Accordingly, in the internal space 35, the plurality of channel portions 34 may be placed with higher space efficiency. Thereby, the number of channel portions 34 may be easily made larger. Therefore, the refrigerant production efficiency in the refrigerant generator 20 may be further improved.

According to the embodiment, the first blower 60 is the cooling blower that sends the air AR1 to the light modulation units 4R, 4G, 4B as the cooling target. Accordingly, the refrigerant W transferred to the light modulation units 4R, 4G, 4B is easily vaporized by the air AR1 and the light modulation units 4R, 4G, 4B may be further cooled. Further, it is not necessary to separately provide another cooling blower for cooling the cooling target than the first blower 60, and the increase of the number of components of the projector 1 may be suppressed and the increase of noise may be suppressed.

As described above, in the embodiment, vaporization of the refrigerant W sent to the cooling target is promoted using the first blower 60 as the suction fan that takes the outside air into the projector 1. Accordingly, even when the output of the first blower 60 is reduced, the equal cooling performance to that without the cooling apparatus 10 can be obtained. Therefore, the output of the first blower 60 as the suction fan is reduced, and thereby, the noise generated from the first blower 60 may be reduced and the quietness of the projector 1 may be further improved.

According to the embodiment, the heater 22 has the heating main body portion 22a that heats the air before passing through the part of the moisture absorbing and desorbing member 40 located in the second region F2, and the second blower 23. Accordingly, the heater 22 sends the air AR2 to the moisture absorbing and desorbing member 40 by the second blower 23 and may heat the part of the moisture absorbing and desorbing member 40 located in the second region F2. Thereby, even when the heating main body portion 22a is placed in the position apart from the moisture absorbing and desorbing member 40, the moisture absorbing and desorbing member 40 may be heated by the heater 22. Therefore, the degree of freedom of the configuration of the heater 22 may be improved.

According to the embodiment, the refrigerant generator 20 has the motor 24 that rotates the moisture absorbing and desorbing member 40. Accordingly, the moisture absorbing and desorbing member 40 may be rotated stably at a constant speed. Thereby, the vapor may be preferably absorbed from the air AR1 by the part of the moisture absorbing and desorbing member 40 located in the first region F1 and the moisture may be preferably released into the air AR2 from the part of the moisture absorbing and desorbing member 40 located in the second region F2. Therefore, the refrigerant W may be efficiently produced.

According to the embodiment, the refrigerant holding portions 71 provided in the light modulation units 4R, 4G, 4B as the cooling target and holding the refrigerant W are provided. Accordingly, the refrigerant W transferred to the light modulation units 4R, 4G, 4B may be held for the light modulation units 4R, 4G, 4B by the refrigerant holding portions 71 until the refrigerant W is vaporized. Thereby, the produced refrigerant W is readily available without waste and the cooling performance of the cooling apparatus 10 may be further improved.

According to the embodiment, the refrigerant holding portions 71 are attached to the surfaces of the light modulation units 4R, 4G, 4B as the cooling target and formed using the porous members. At least parts of the refrigerant holding portions 71 are exposed as seen from the refrigerant holding portions 71 sides in the overlap direction. Accordingly, the refrigerant W is easily vaporized from the exposed parts of the refrigerant holding portions 71 and the cooling performance of the cooling apparatus 10 may be further improved. The refrigerant holding portions 71 are formed using the porous members, and thereby, the refrigerant W may be uniformly spread on the surfaces of the cooling target with the refrigerant holding portions 71 provided thereon by capillary action and the cooling target may be cooled more easily.

For example, when the refrigerant holding portions 71 are fixed to the holder frames 80 using the adhesives, the adhesives may be absorbed by the refrigerant holding portions 71 and the pores of the refrigerant holding portions 71 formed using the porous members may be blocked. Accordingly, the refrigerant W may be harder to be absorbed by the refrigerant holding portions 71 and the refrigerant W may be harder to be held by the refrigerant holding portions 71.

On the other hand, according to the embodiment, the fixing members 72 that fix the refrigerant holding portions 71 between the holder frames 80 and themselves are provided. Accordingly, the refrigerant holding portions 71 may be fixed to the holder frames 80 without using the adhesives. Thereby, the difficulty in holding of the refrigerant W by the refrigerant holding portions 71 may be suppressed. Further, in the embodiment, the fixing members 72 are formed using the metals. Accordingly, the fixing members 72 have higher thermal conductivity and are easily cooled. Therefore, the temperatures of the fixing members 72 may be easily lower by the air AR1 from the first blower 60 and the vaporization of the refrigerant W, and the cooling target in contact with the fixing members 72 may be cooled more easily.

According to the embodiment, the refrigerant holding portion 71 is provided on the surface at the light incident side of the light modulator 4GP. Accordingly, the influence on the light output from the light modulator 4GP to the light combining system 5 by the vapor of the refrigerant W vaporized from the refrigerant holding portion 71 may be suppressed. Thereby, noise generated in the image projected from the projector 1 may be suppressed.

According to the embodiment, the refrigerant holding portions 71 are respectively provided in the plurality of light modulation units 4R, 4G, 4B, and the coupling portions 73a, 73b coupling the plurality of refrigerant holding portions 71 to each other are provided. Accordingly, the refrigerant sender 50 is coupled to the single refrigerant holding portion 71 and the refrigerant W may be transferred to the other refrigerant holding portions 71. Thereby, routing of the refrigerant sender 50 inside of the projector 1 may be simplified.

According to the embodiment, the covers 74 that respectively cover the coupling portions 73a, 73b are provided on the coupling portions 73a, 73b. Accordingly, vaporization of the refrigerant W moving along the coupling portions 73a, 73b in the coupling portions 73a, 73b may be suppressed. Thereby, the vaporization of the refrigerant W without contribution to the cooling of the light modulation units 4R, 4G, 4B as the cooling target may be suppressed and a waste of the produced refrigerant W may be suppressed.

Note that, in the embodiment, the coupling part 54 may be covered like the coupling portions 73a, 73b. According to the configuration, vaporization of the refrigerant W while being transferred to the cooling target may be suppressed. Accordingly, the refrigerant W may be efficiently transferred to the cooling target and the waste of the produced refrigerant W may be further suppressed. The coupling part 54 and the coupling portions 73a, 73b may be covered around by e.g. tubes or the like. Or, the coupling part 54 and the coupling portions 73a, 73b may be coated on the surfaces for suppression of evaporation.

MODIFIED EXAMPLES

Figure 11:
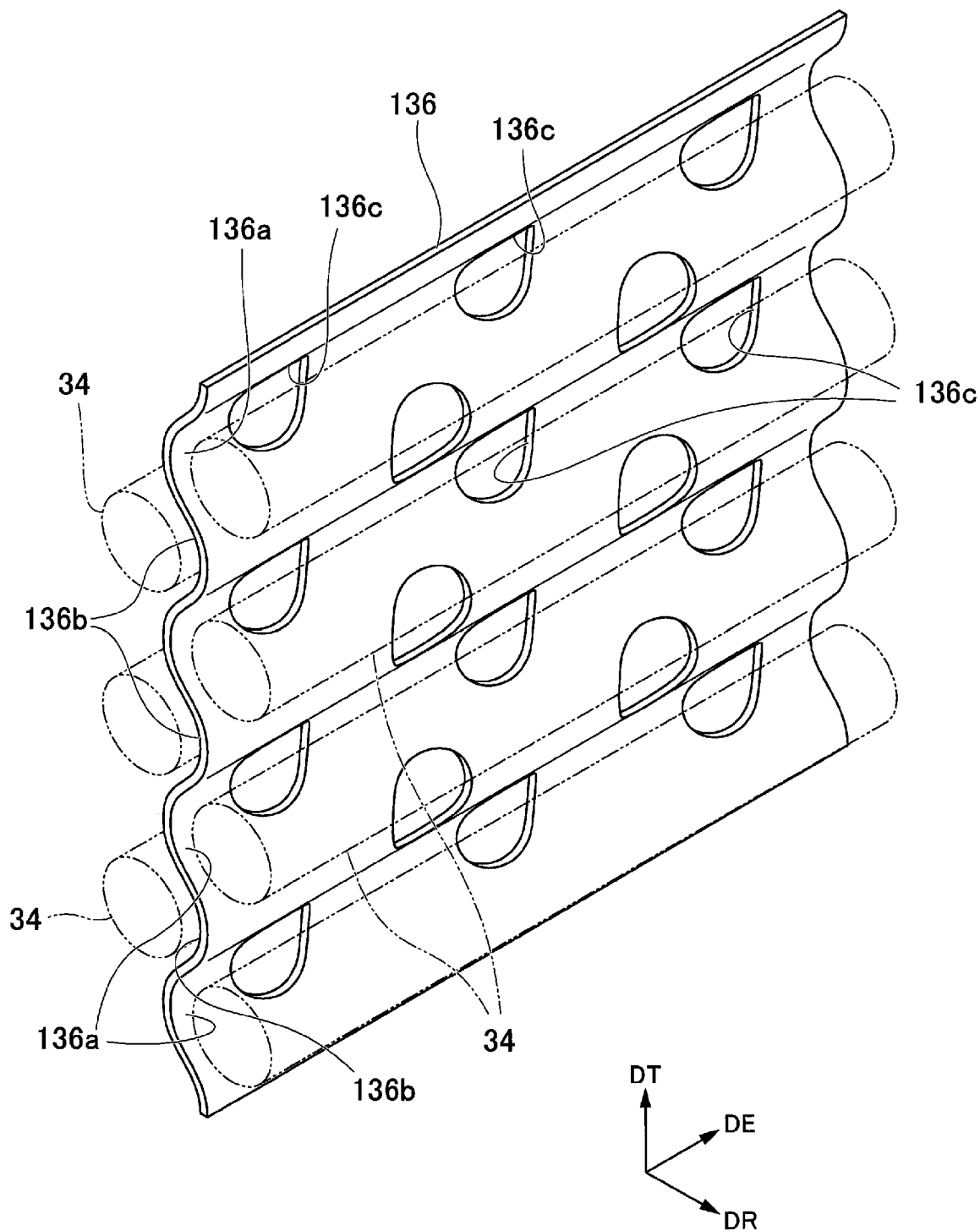
FIG. 11 is a perspective view showing an air guide portion in a modified example of the first embodiment.

FIG. 11 is the perspective view showing the air guide portion 136 in the modified example of the first embodiment. Note that the explanation of the same configurations as those of the above described embodiment may be omitted by appropriate attachment of the same signs or the like.

As shown in FIG. 11, the air guide portion 136 in the modified example has a curved shape, not the flat plate shape. More specifically, the air guide portion 136 has a corrugated shape. The air guide portion 136 has a sinusoidal shape extending in e.g. the height direction DT as seen along the extension direction DE. Note that the air guide portion 136 may be e.g. a triangular wave shape or rectangular wave shape as seen along the extension direction DE.

Because of the wave shape, concave portions 136a, 136b respectively extending in the extension direction DE are provided in both plate surfaces in the rotation axis direction DR of the air guide portion 136. The concave portion 136a is recessed from the surface at one side in the rotation axis direction DR of the air guide portion 136 toward the other side in the rotation axis direction DR. The concave portion 136b is recessed from the surface at the other side in the rotation axis direction DR of the air guide portion 136 toward the one side in the rotation axis direction DR. Pluralities of the concave portions 136a and the concave portions 136b are respectively provided apart along the height direction DT. The concave portion 136b is located between the concave portions 136a adjacent to each other in the height direction DT. The concave portion 136a is located between the concave portions 136b adjacent to each other in the height direction DT.

The air guide portion 136 has through holes 136c penetrating the air guide portion 136. In the modified example, the through holes 136c penetrate the air guide portion 136 in the rotation axis direction DR. The through holes 136c are e.g. circular holes as seen along the rotation axis direction DR. A plurality of the through holes 136c are provided. In the modified example, the through holes 136c are provided in bottom parts of the concave portions 136a and bottom parts of the concave portions 136b. The plurality of the through holes 136c are respectively provided apart along the extension direction DE in the bottom parts of the concave portions 136a and the bottom parts of the concave portions 136b. The through holes 136c provided in the concave portions 136a and the through holes 136c provided in the concave portions 136b are placed not to overlap with each other. The plurality of the through holes 136c are placed in a staggered manner as seen along the rotation axis direction DR.

According to the modified example, the air guide portion 136 has the curved shape. Accordingly, the air guide portion 136 may be placed in the internal space 35 while avoiding the plurality of channel portions 34 placed in the internal space 35. Specifically, in the modified example, the air guide portion 136 has the corrugated shape. Accordingly, as shown in FIG. 11, the channel portions 34 may be isolated by the concave portions 136a, 136b. Thereby, even when the gaps between the channel portions 34 are narrower, the air guide portion 136 is easily placed in the internal space 35.

The air guide portion 136 has the curved shape, and thus, the air AR2 in the internal space 35 is easily guided along the curved parts. Specifically, when the air guide portion 136 has the corrugated shape as in the modified example, the air AR2 is easily guided along the concave portions 136a, 136b extending in the extension direction DE. Thereby, the air AR2 is easily spread to the whole in the extension direction DE in the internal space 35.

Further, according to the modified example, the air guide portion 136 has the through holes 136c penetrating the air guide portion 136. Accordingly, the refrigerant W produced in the internal space 35 may be passed through the through holes 136c and the disturbance of the movement of the refrigerant W in the internal space 35 by the air guide portion 136 may be suppressed. Thereby, even when the air guide portion 136 is provided, the refrigerant W is easily collected to one location within the internal space 35. Therefore, even when the posture of the projector 1 changes or the like, the refrigerant W within the internal space 35 is easily sent to the cooling target more easily by the refrigerant sender 50.

When the air guide portion 136 has the corrugated shape as in the modified example, accumulation of the refrigerant W in the concave portions 136a, 136b is considered. In this case, the through holes 136c are provided in the bottom parts of the concave portions 136a, 136b, and thus, the refrigerant W accumulated in the concave portions 136a, 136b may be preferably extracted from the through holes 136c. Thereby, the refrigerant W is easily collected to one location within the internal space 35.

Second Embodiment

Figure 12:
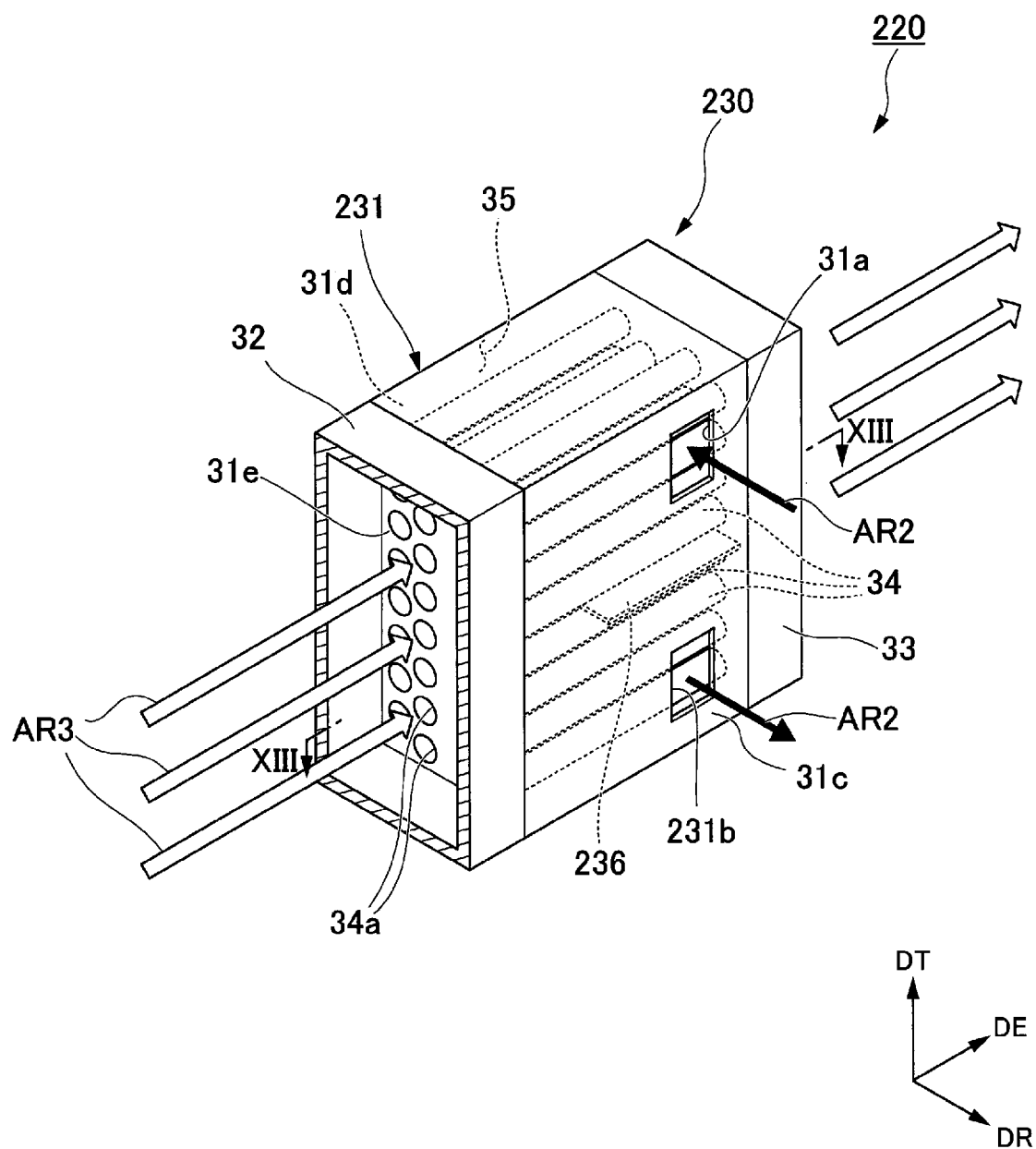
FIG. 12 is a partially sectional perspective view showing a heat exchanger of a second embodiment.
Figure 13:
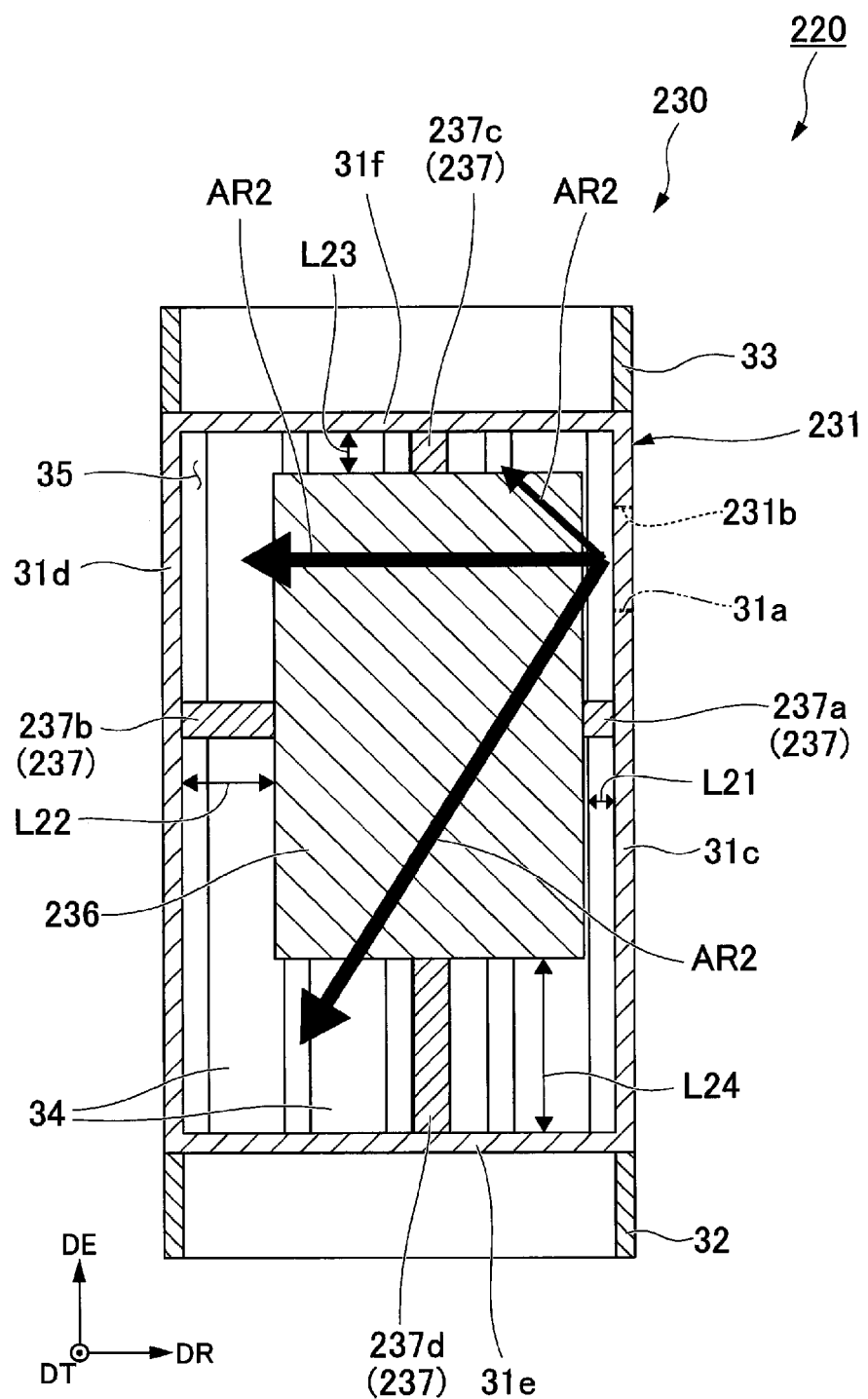
FIG. 13 is a sectional view showing the heat exchanger of the second embodiment along XIII-XIII in FIG. 12.

This embodiment is different in the configuration of a heat exchanger 230 from the first embodiment. Note that the explanation of the same configurations as those of the above described embodiment may be omitted by appropriate attachment of the same signs or the like. FIG. 12 is the partially sectional perspective view showing the heat exchanger 230 of the embodiment. FIG. 13 is the sectional view showing the heat exchanger 230 along XIII-XIII in FIG. 12.

Note that, in the embodiment, the rotation axis direction DR corresponds to the first direction. The one side in the rotation axis direction DR corresponds to one side in the first direction and the other side in the rotation axis direction DR corresponds to the other side in the first direction. In the embodiment, the extension direction DE corresponds to the second direction. The one side in the extension direction DE corresponds to one side in the second direction and the other side in the extension direction DE corresponds to the other side in the second direction.

As shown in FIG. 12, in the heat exchanger 230 of a refrigerant generator 220 of the embodiment, a housing 231 has the inlet port 31a and an outlet port 231b in the side wall portion (first wall portion) 31c at one side (+DR side) in the rotation axis direction DR of the plurality of side wall portions forming the housing 231. The inlet port 31a and the outlet port 231b are placed apart in the height direction DT. The outlet port 231b is located at the other side (−DT side) in the height direction DT with respect to the inlet port 31a. For example, the outlet port 231b has the same shape and size as the inlet port 31a. The inlet port 31a and the outlet port 231b are provided in a part closer to one side (+DE side) in the extension direction DE in the side wall portion 31c. The air AR2 is exhausted from the internal space 35 via the outlet port 231b from the other side (−DR side) in the rotation axis direction DR to the one side (+DR side) in the rotation axis direction DR.

In the embodiment, as shown in FIGS. 12 and 13, an air guide portion 236 has a plate shape with a plate surface facing the height direction DT. More specifically, the air guide portion 236 has a rectangular plate shape elongated in the extension direction DE. The plate surface of the air guide portion 236 is e.g. a flat surface orthogonal to the height direction DT.

In the embodiment, as shown in FIG. 12, the air guide portion 236 is located between the inlet port 31a and the outlet port 231b as seen along the rotation axis direction DR. The position of the air guide portion 236 in the height direction DT is at the center between the position of the inlet port 31a in the height direction DT and the position of the outlet port 231b in the height direction DT.

As shown in FIG. 13, in the embodiment, the air guide portion 236 is placed closer to the one side (+DR side) in the rotation axis direction DR and closer to the one side (+DE side) in the extension direction DE in the internal space 35. In the embodiment, the air guide portion 236 is placed apart from the inner wall surfaces of the housing 231. Gaps are respectively provided between the respective sides of the air guide portion 236 in the rectangular plate shape and the inner wall surfaces of the housing 231.

A distance L22 between the side wall portion (second side wall portion) 31d at the other side (−DR side) in the rotation axis direction DR of the plurality of side wall portions forming the housing 231 and the air guide portion 236 is larger than a distance L21 between the side wall portion (first side wall portion) 31c at the one side (+DR side) in the rotation axis direction DR of the plurality of side wall portions and the air guide portion 236. The distance L21 corresponds to the dimension of the gap between the edge at the one side in the rotation axis direction DR of the air guide portion 236 and the side wall portion 31c along the rotation axis direction DR. The distance L22 corresponds to the dimension of the gap between the edge at the other side in the rotation axis direction DR of the air guide portion 236 and the side wall portion 31d along the rotation axis direction DR. For example, the distance L22 is equal to or larger than twice the distance L21.

A distance L24 between the side wall portion (third side wall portion) 31e at the other side (−DE side) in the extension direction DE of the plurality of side wall portions and the air guide portion 236 is larger than a distance L23 between the side wall portion (fourth side wall portion) 31f at the one side (+DE side) in the extension direction DE of the plurality of side wall portions and the air guide portion 236. The distance L23 corresponds to the dimension of the gap between the edge at the one side in the extension direction DE of the air guide portion 236 and the side wall portion 31f along the extension direction DE. The distance L24 corresponds to the dimension of the gap between the edge at the other side in the extension direction DE of the air guide portion 236 and the side wall portion 31e along the extension direction DE. For example, the distance L24 is equal to or larger than twice the distance L23.

In the embodiment, fixing portions 237 include four fixing portions 237a, 237b, 237c, 237d. The fixing portion 237a connects and fixes the edge at the one side (+DR side) in the rotation axis direction DR of the air guide portion 236 and the side wall portion 31c. The fixing portion 237b connects and fixes the edge at the other side (−DR side) in the rotation axis direction DR of the air guide portion 236 and the side wall portion 31d. The fixing portion 237c connects and fixes the edge at the one side (+DE side) in the extension direction DE of the air guide portion 236 and the side wall portion 31f. The fixing portion 237d connects and fixes the edge at the other side (−DE side) in the extension direction DE of the air guide portion 236 and the side wall portion 31e.

The rest of the configuration of the refrigerant generator 220 is the same as the rest of the configuration of the refrigerant generator 20 of the first embodiment.

According to the embodiment, both the inlet port 31a and the outlet port 231b are provided in the side wall portion 31c at the one side in the rotation axis direction DR of the plurality of side wall portions forming the housing 231, and the air guide portion 236 is located between the inlet port 31a and the outlet port 231b as seen along the rotation axis direction DR. Accordingly, the air AR2 flowing into the internal space 35 from the inlet port 31a and moving to the other side in the height direction DT toward the outlet port 231b contacts the air guide portion 236 and is easily guided in the direction orthogonal to the height direction DT along the air guide portion 236. Thereby, the air AR2 is easily widely spread within the internal space 35. Therefore, the contact area between the air AR2 and the channel portions 34 may be easily increased and the refrigerant production efficiency in the refrigerant generator 220 may be further improved.

Further, in the embodiment, both the inlet port 31a and the outlet port 231b are provided in the side wall portion 31c at the one side in the rotation axis direction DR of the plurality of side wall portions, and thus, without the air guide portion 236, the air AR2 may be harder to flow to the part closer to the other side in the rotation axis direction DR of the internal space 35.

On the other hand, according to the embodiment, the distance L22 between the side wall portion 31d at the other side in the rotation axis direction DR of the plurality of side wall portions and the air guide portion 236 is larger than the distance L21 between the side wall portion 31c at the one side in the rotation axis direction DR of the plurality of side wall portions and the air guide portion 236. Accordingly, the air AR2 is easier to pass through the gap between the side wall portion 31d and the air guide portion 236 than the gap between the side wall portion 31c and the air guide portion 236. Thereby, as shown in FIG. 13, the air AR2 flowing into the internal space 35 from the inlet port 31a flows toward the other side (−DR side) in the rotation axis direction DR in the larger amount. Therefore, the air AR2 may be easier to flow to the part closer to the other side in the rotation axis direction DR of the internal space 35 and the air AR2 is easily spread more widely within the internal space 35.

Accordingly, the refrigerant production efficiency in the refrigerant generator 220 may be further improved.

Further, in the embodiment, the inlet port 31a and the outlet port 231b are provided in the part closer to the one side in the extension direction DE in the side wall portion 31c. Accordingly, without the air guide portion 236, the air AR2 may be harder to flow to the part closer to the other side in the extension direction DE of the internal space 35.

On the other hand, according to the embodiment, the distance L24 between the side wall portion 31e at the other side in the extension direction DE of the plurality of side wall portions and the air guide portion 236 is larger than the distance L23 between the side wall portion 31f at the one side in the extension direction DE of the plurality of side wall portions and the air guide portion 236. Accordingly, the air AR2 is easier to pass through the gap between the side wall portion 31e and the air guide portion 236 than the gap between the side wall portion 31f and the air guide portion 236. Thereby, as shown in FIG. 13, the air AR2 flowing into the internal space 35 from the inlet port 31a flows toward the other side (−DE side) in the extension direction DE in the larger amount than that toward the one side (+DE side) in the extension direction DE. Therefore, the air AR2 may be easier to flow to the part closer to the other side in the extension direction DE of the internal space 35 and the air AR2 is easily spread more widely within the internal space 35. Accordingly, the refrigerant production efficiency in the refrigerant generator 220 may be further improved.

Third Embodiment

Figure 14:
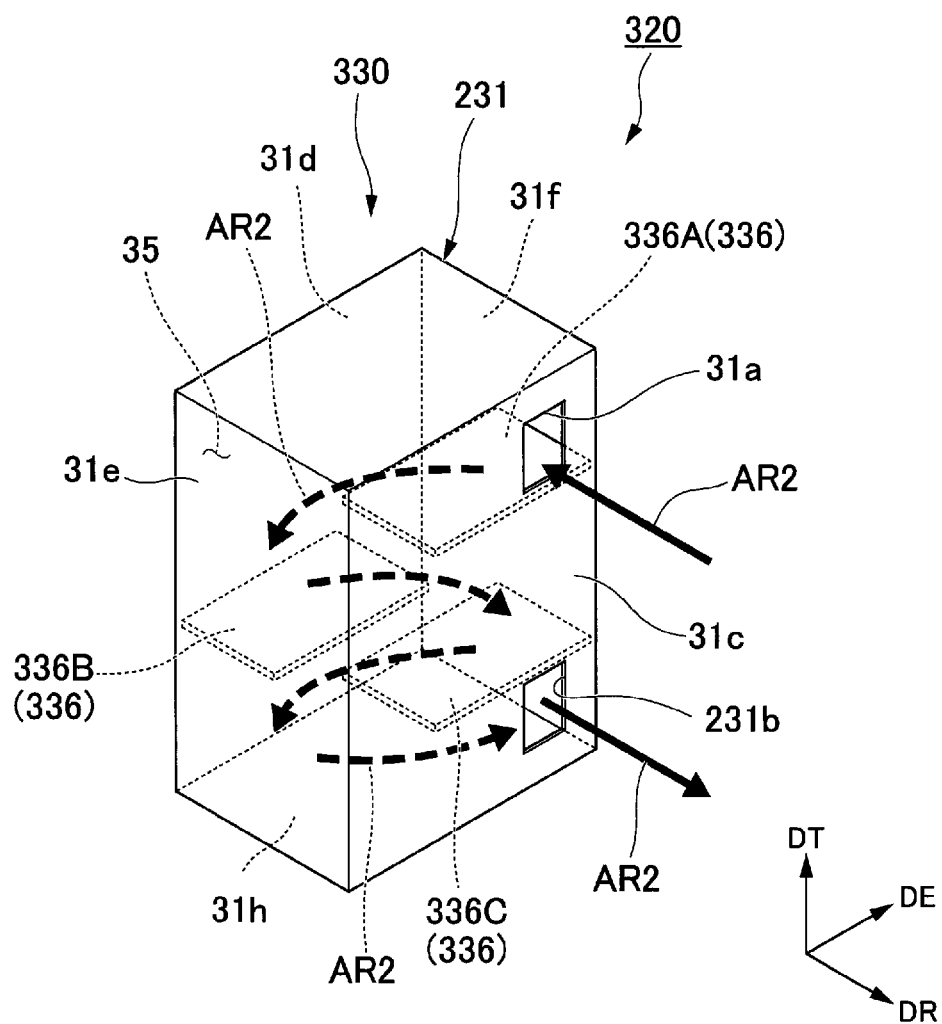
FIG. 14 is a perspective view showing a part of a heat exchanger of a third embodiment.

This embodiment is different in the configuration of a heat exchanger 330 from the first embodiment. Note that the explanation of the same configurations as those of the above described embodiment may be omitted by appropriate attachment of the same signs or the like. FIG. 14 is the perspective view showing the part of the heat exchanger 330 of the embodiment. In FIG. 14, illustration of the inflow duct 32, the outflow duct 33, and the channel portions 34 is omitted.

As shown in FIG. 14, in the heat exchanger 330 of a refrigerant generator 320 of the embodiment, a plurality of air guide portions 336 are provided. Three of the air guide portions 336 e.g. the air guide portion 336A, the air guide portion 336B, and the air guide portion 336C are provided. The air guide portions 336A, 336B, 336C have plate shapes with plate surface facing the height direction DT. More specifically, the air guide portions 336A, 336B, 336C have rectangular plate shapes elongated in the extension direction DE. The plate surfaces of the air guide portions 336A, 336B, 336C are e.g. flat surfaces orthogonal to the height direction DT.

In the embodiment, the air guide portions 336A, 336B, 336C are located between the inlet port 31a and the outlet port 231b as seen along the rotation axis direction DR. The air guide portion 336A and the air guide portion 336C are placed apart in the height direction DT. The air guide portion 336A is located at one side (+DT side) in the height direction DT with respect to the air guide portion 336C. The position of the air guide portion 336B in the height direction DT is at the center between the position of the air guide portion 336A in the height direction DT and the position of the air guide portion 336C in the height direction DT.

In the embodiment, the air guide portions 336A, 336C are placed closer to the one side (+DR side) in the rotation axis direction DR and closer to the one side (+DE side) in the extension direction DE in the internal space 35. In the embodiment, the air guide portion 336B is placed closer to other side (−DR side) in the rotation axis direction DR and closer to the other side (−DE side) in the extension direction DE in the internal space 35. In the embodiment, the air guide portions 336A, 336B, 336C are placed apart from the inner wall surfaces of the housing 231. The air guide portions 336A, 336C and the air guide portion 336B partially overlap each other as seen along the height direction DT.

The rest of the configuration of the refrigerant generator 320 is the same as the rest of the configuration of the refrigerant generator 20 of the first embodiment.

According to the embodiment, the plurality of air guide portions 336 are provided. Accordingly, the air AR2 flowing into the internal space 35 may be guided more preferably by the plurality of air guide portions 336. Thereby, the air AR2 is easily spread more widely within the internal space 35. Therefore, the contact area between the air AR2 and the channel portions 34 is easily increased and the refrigerant production efficiency in the refrigerant generator 320 may be further improved.

Specifically, in the embodiment, the air AR2 flowing into the internal space 35 from the inlet port 31a is easily guided toward the other side (−DR side) in the rotation axis direction DR and toward the other side (−DE side) in the extension direction DE by the air guide portion 336A. The air AR2 guided toward the other side in the rotation axis direction DR and toward the other side in the extension direction DE by the air guide portion 336A is easily guided toward the one side (+DR side) in the rotation axis direction DR and toward the one side (+DE side) in the extension direction DE by the air guide portion 336B. The air AR2 guided toward the one side in the rotation axis direction DR and toward the one side in the extension direction DE by the air guide portion 336B is easily guided toward the other side in the rotation axis direction DR and toward the other side in the extension direction DE again by the air guide portion 336C. The air AR2 guided toward the other side in the rotation axis direction DR and toward the other side in the extension direction DE by the air guide portion 336C flows toward the one side in the rotation axis direction DR and toward the one side in the extension direction DE again along the side wall portion 31h as a bottom wall portion of the housing 231 and is exhausted from the outlet port 231b.

As described above, in the embodiment, the air AR2 flowing into the internal space 35 from the inlet port 31a flows alternately toward the one sides and the other sides in the rotation axis direction DR and the extension direction DE and flows from the one side (+DT side) to the other side (−DT side) in the height direction DT. Thereby, according to the embodiment, the air AR2 is easily spread to the whole in the internal space 35.

Fourth Embodiment

Figure 15:
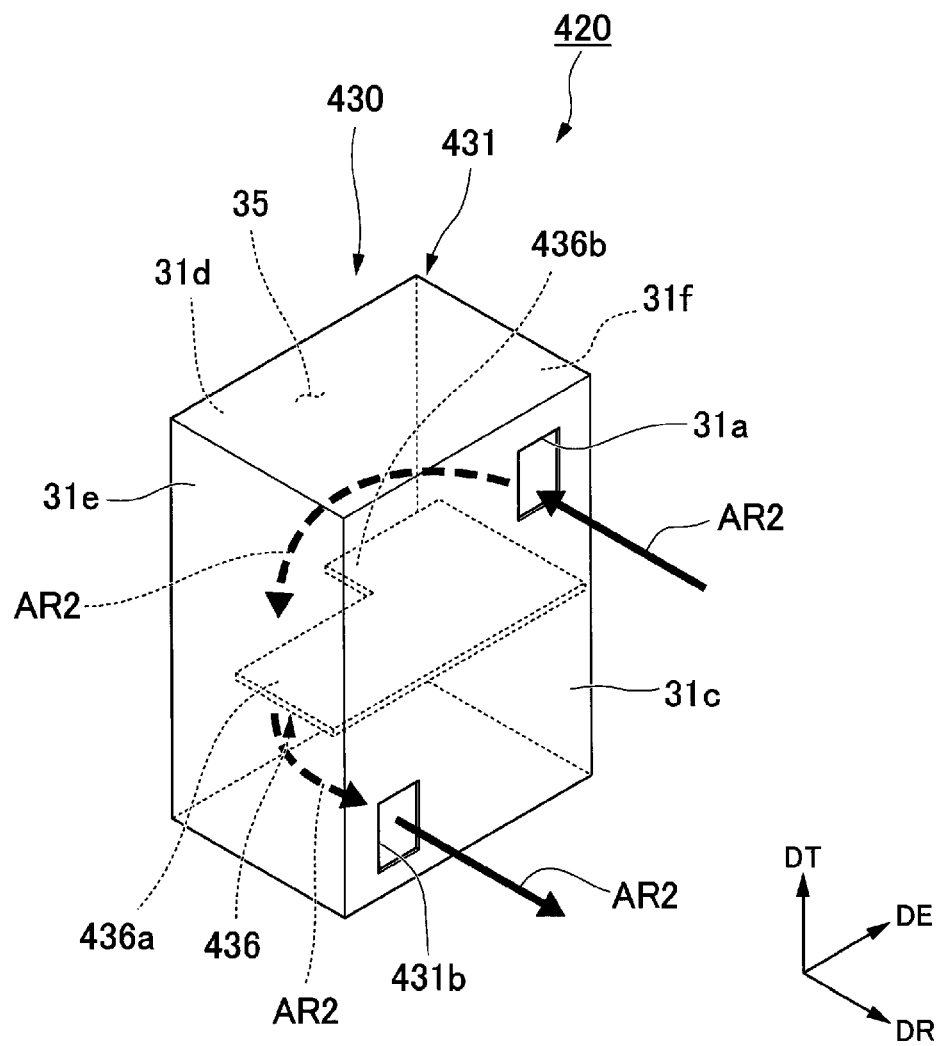
FIG. 15 is a perspective view showing a part of a heat exchanger of a fourth embodiment.

This embodiment is different in the configuration of a heat exchanger 430 from the first embodiment. Note that the explanation of the same configurations as those of the above described embodiment may be omitted by appropriate attachment of the same signs or the like. FIG. 15 is the perspective view showing the part of the heat exchanger 430 of the embodiment. In FIG. 15, illustration of the inflow duct 32, the outflow duct 33, and the channel portions 34 is omitted.

As shown in FIG. 15, in the heat exchanger 430 of a refrigerant generator 420 of the embodiment, a housing 431 has the inlet port 31a and an outlet port 431b in the side wall portion 31c at the one side (+DR side) in the rotation axis direction DR. The outlet port 431*b* is provided in a part closer to the other side (−DE side) in the extension direction DE and closer to the other side (−DT side) in the height direction DT in the side wall portion 31*c*. In the embodiment, the inlet port 31*a* and the outlet port 431*b* are placed in diagonal positions in the rectangular side wall portion 31*c*. For example, the outlet port 431*b* has the same shape and size as the inlet port 31*a*. The air AR2 is exhausted from the internal space 35 via the outlet port 431*b* from the other side (−DR side) in the rotation axis direction DR to the one side (+DR side) in the rotation axis direction DR.

In the embodiment, an air guide portion 436 has a plate shape with a plate surface facing the height direction DT. The plate surface of the air guide portion 436 is e.g. a flat surface orthogonal to the height direction DT. In the embodiment, the air guide portion 436 is located between the inlet port 31*a* and the outlet port 431*b* as seen along the rotation axis direction DR. The position of the air guide portion 436 in the height direction DT is at the center between the position of the inlet port 31*a* in the height direction DT and the position of the outlet port 431*b* in the height direction DT. In the embodiment, the air guide portion 436 is placed apart from the inner wall surfaces of the housing 431.

The air guide portion 436 has an air guide portion main body 436*a* and a projecting portion 436*b* projecting from the air guide portion main body 436*a*. The air guide portion main body 436*a* has a rectangular shape elongated in the extension direction DE. In the embodiment, the air guide portion main body 436*a* is placed closer to the one side (+DR side) in the rotation axis direction DR in the internal space 35.

The projecting portion 436*b* projects from a part at the one side (+DE side) in the extension direction DE of the air guide portion main body 436*a* to the other side (−DR side) in the rotation axis direction DR. The projecting portion 436*b* has a rectangular shape elongated in the extension direction DE. The distance between the projecting portion 436*b* and the side wall portion 31*d* along the rotation axis direction DR is smaller than the distance between the air guide portion main body 436*a* and the side wall portion 31*d* along the rotation axis direction DR.

The rest of the configuration of the refrigerant generator 420 is the same as the rest of the configuration of the refrigerant generator 20 of the first embodiment.

According to the embodiment, the air guide portion 436 has the air guide portion main body 436*a* and the projecting portion 436*b*. Accordingly, the size of the gap between the air guide portion 436 and the inner wall surface of the housing 431 may be partially narrowed by the projecting portion 436*b*. Thereby, the position of the projecting portion 436*b* is determined according to the positions of the inlet port 31*a* and the outlet port 431*b* or the like and the air AR2 may be easily widely spread within the internal space 35. Therefore, the contact area between the air AR2 and the channel portions is easily increased and the refrigerant production efficiency in the refrigerant generator 420 may be further improved.

Specifically, in the embodiment, in the part at the one side in the extension direction DE in which the projecting portion 436*b* is provided, the gap between the air guide portion 436 and the side wall portion 31*d* is narrower and the air AR2 is harder to pass. On the other hand, in the part at the other side in the extension direction DE of the air guide portion 436, the gap between the air guide portion 436 and the side wall portion 31*d* is wider and the air AR2 is easier to pass. Accordingly, the air AR2 flowing into the internal space 35 from the inlet port 31*a* flows toward the other side in the rotation axis direction DR and toward the other side in the extension direction DE and easily passes through the gap between the part at the other side in the extension direction DE of the air guide portion 436 and the side wall portion 31*d* toward the other side in the height direction DT. The air AR2 passing through the gap between the part at the other side in the extension direction DE of the air guide portion 436 and the side wall portion 31*d* is exhausted from the outlet port 431*b*.

Fifth Embodiment

Figure 16:
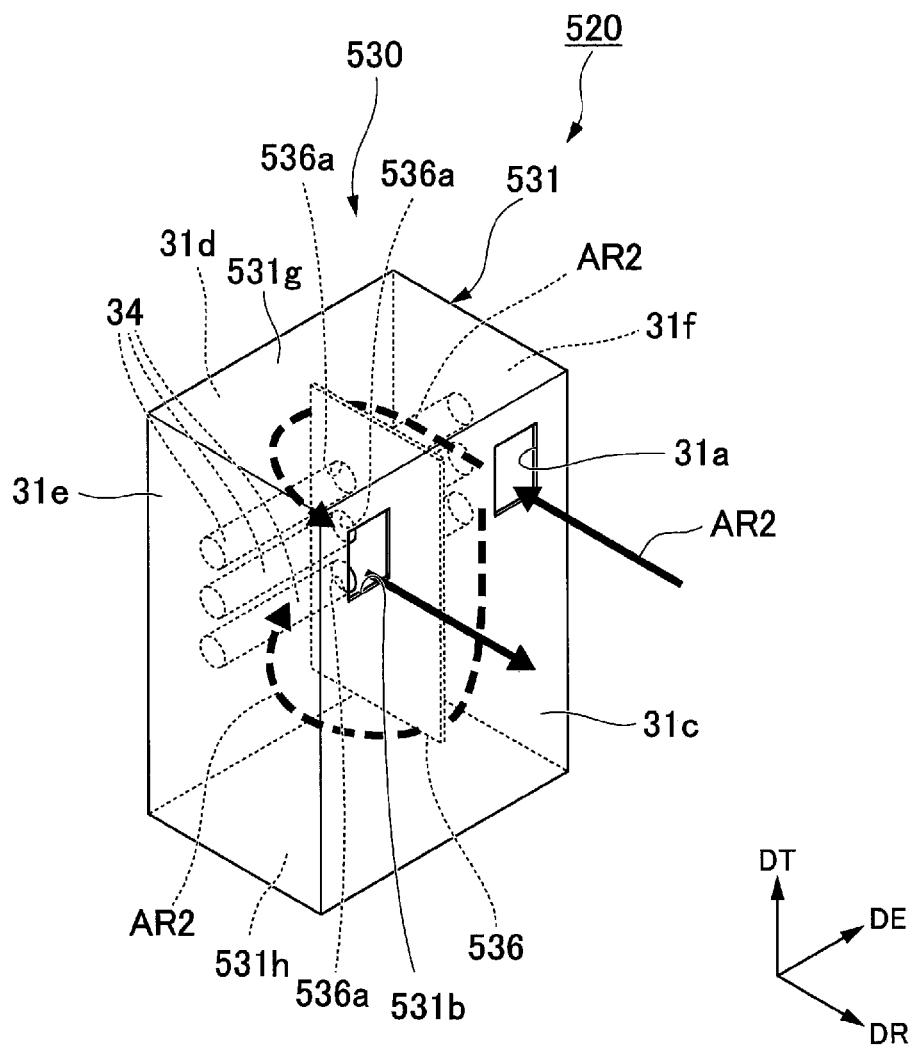
FIG. 16 is a perspective view showing a part of a heat exchanger of a fifth embodiment.

This embodiment is different in the configuration of a heat exchanger 530 from the first embodiment. Note that the explanation of the same configurations as those of the above described embodiment may be omitted by appropriate attachment of the same signs or the like. FIG. 16 is the perspective view showing the part of the heat exchanger 530 of the embodiment. In FIG. 16, illustration of the inflow duct 32, the outflow duct 33, and the channel portions 34 is omitted.

In the embodiment, the rotation axis direction DR corresponds to the first direction. The one side in the rotation axis direction DR corresponds to one side in the first direction and the other side in the rotation axis direction DR corresponds to the other side in the first direction. In the embodiment, the height direction DT corresponds to the second direction. The one side in the height direction DT corresponds to one side in the second direction and the other side in the height direction DT corresponds to the other side in the second direction.

As shown in FIG. 16, in the heat exchanger 530 of a refrigerant generator 520 of the embodiment, a housing 531 has the inlet port 31*a* and an outlet port 531*b* in the side wall portion 31*c* at the one side (+DR side) in the rotation axis direction DR. The inlet port 31*a* and the outlet port 531*b* are placed apart in the extension direction DE. The outlet port 531*b* is located at the other side (−DE side) in the extension direction DE with respect to the inlet port 31*a*. For example, the outlet port 531*b* has the same shape and size as the inlet port 31*a*. The inlet port 31*a* and the outlet port 531*b* are provided in a part closer to the one side (+DT side) in the height direction DT in the side wall portion 31*c*. The air AR2 is exhausted from the internal space 35 via the outlet port 531*b* from the other side (−DR side) in the rotation axis direction DR to the one side (+DR side) in the rotation axis direction DR.

In the embodiment, an air guide portion 536 has a plate shape with a plate surface facing the extension direction DE. More specifically, the air guide portion 536 has a rectangular plate shape elongated in the height direction DT. The plate surface of the air guide portion 536 is e.g. a flat surface orthogonal to the extension direction DE. In the embodiment, the air guide portion 536 is located between the inlet port 31*a* and the outlet port 531*b* as seen along the rotation axis direction DR. The position of the air guide portion 536 in the extension direction DE is at the center between the position of the inlet port 31*a* in the extension direction DE and the position of the outlet port 531*b* in the extension direction DE.

In the embodiment, the air guide portion 536 is placed closer to the one side (+DR side) in the rotation axis direction DR and closer to the one side (+DT side) in the height direction DT in the internal space 35. A distance between a side wall portion (third side wall portion) 531*h* at the other side (−DT side) in the height direction DT of the plurality of side wall portions forming the housing 531 and the air guide portion 536 is larger than a distance between a side wall portion (fourth side wall portion) 531g at the one side (+DT side) in the height direction DT of the plurality of side wall portions and the air guide portion 536. In the embodiment, the air guide portion 536 is placed apart from the inner wall surfaces of the housing 531. Gaps are respectively provided between the respective sides of the air guide portion 536 in the rectangular plate shape and the internal wall surfaces of the housing 531.

In the embodiment, the air guide portion 536 has a plurality of holes 536a penetrating the air guide portion 536 in the extension direction DE. The holes 536a are e.g. circular holes. The channel portions 34 are respectively passed through the holes 536a in the extension direction DE. The inner circumference surface of the hole 536a and the outer circumference surface of the channel portion 34 are fixed. Thereby, in the embodiment, the air guide portion 536 is in contact with the channel portions 34 as the heat absorbing portions. In the embodiment, the air guide portion 536 and the channel portions 34 are formed using metals. The material of the guide portion 536 and the material of the channel portions 34 are preferably metals having higher thermal conductivity. The material of the guide portion 536 and the material of the channel portions 34 are e.g. aluminum, iron, copper, or the like. The fixation of the air guide portion 536 and the channel portions 34 is not particularly limited to, but includes welding.

The rest of the configuration of the refrigerant generator 520 is the same as the rest of the configuration of the refrigerant generator 20 of the first embodiment.

According to the embodiment, the air guide portion 536 contacts the channel portions 34 and the air guide portion 536 and the channel portions 34 are formed using the metals. Accordingly, when the cooling air AR3 is circulated within the channel portions 34, the temperatures of the channel portions 34 are lower and the temperature of the air guide portion 536 in contact with the channel portions 34 is also lower. Thereby, the air guide portion 536 may also remove heat from the air AR2 in the internal space 35. In other words, the air guide portion 536 may also function as the heat absorbing portion. Therefore, the refrigerant W may also be produced by contact of the air AR2 with the air guide portion 536 and the refrigerant production efficiency in the refrigerant generator 520 may be further improved. Further, the amount of produced refrigerant W may be maintained even when the number of channel portions 34 is reduced by the function of the air guide portion 536 as the heat absorbing portion. Thereby, the heat exchanger 530 may be downsized.

Note that the embodiments of the present disclosure are not limited to the above described embodiments and the following configurations may be employed.

The air guide portion is not particularly limited as long as the portion guides the air flowing into the internal space. The air guide portion may be placed in any position in the internal space or the air may be guided in the internal space in any manner. The shape of the air guide portion is not particularly limited to the plate shape. The air guide portion may have e.g. a tubular shape. The number of air guide portions is not particularly limited, but may be one or more.

A plurality of the air guide portions may be provided in the above described first embodiment, second embodiment, fourth embodiment, and fifth embodiment. The air guide portion may have the shape like the air guide portion 136 shown in FIG. 11 or may have the through holes 136c like the air guide portion 136 shown in FIG. 11 in the above described second embodiment to fifth embodiment. The air guide portion may have a shape folded in two, not the corrugated shape. The air guide portion may contact the channel portions (heat absorbing portions) in the first embodiment to fourth embodiment. The air guide portion may contact the channel portions (heat absorbing portions) without being fixed thereto in the fifth embodiment.

The number of the fixing portions fixing the air guide portion to the inner wall surfaces of the housing is not particularly limited. The edges of the air guide portion may be fixed directly to the inner wall surfaces of the housing. In this case, the fixing portions connecting and fixing the air guide portion and the inner wall surfaces of the housing are not necessarily provided.

The method of circulating the cooling air in the inner parts of the plurality of channel portions is not particularly limited. For example, in the above described embodiments, the air AR1 released from the first blower 60 may be entered into the channel portions 34 as the cooling air. According to the configuration, it is not necessary to separately provide the third blower 61 and the increase of the number of components of the projector 1 may be suppressed. Compared to a case where the third blower 61 is separately provided, the increase of noise generated from the projector 1 may be suppressed. In this configuration, for example, the inflow duct 32 may be extended to the one side (+DR side) in the rotation axis direction DR of the moisture absorbing and desorbing member 40 and the air AR1 passing through the moisture absorbing and desorbing member 40 may be entered into the inflow duct 32.

The configuration of the channel portions is not particularly limited as long as the portions are placed within the internal space and the inner parts are isolated from the internal space. The channel portions may extend in curved lines. The channel portions are not necessarily the guide tubes, but e.g. holes through which the cooling air passes may be formed inside of columnar portions or the like placed within the internal space. The plurality of channel portions may extend in different directions from one another. The number of the channel portions is not particularly limited, but may be two or more.

The heat absorbing portion is not necessarily the channel portion as long as the portion is placed within the internal space and can remove heat from the air in the internal space. The heat absorbing portion may be e.g. a heat sink placed over the outside and the inside of the housing. In this case, for example, the heat sink is cooled outside of the housing and removes heat from the air in the internal space by the part placed in the internal space. The heat absorbing portions may be a plurality of fins provided in the inner wall surfaces of the housing of the heat exchanger, i.e., the inner side surfaces forming the internal space. In this case, the area of the inner side surfaces of the internal space may be increased and the vapor contained in the air in the inner side surfaces of the internal space may be easily condensed. The heat absorbing portions may include both a plurality of channel portions and a plurality of fins provided in the inner side surfaces forming the internal space. Thereby, the refrigerant production efficiency may be further improved. Only one heat absorbing portion may be provided.

The refrigerant generator may have an external blower that sends air to the housing from the outside of the housing. As the external blower, e.g. an external blower 160 shown by dashed-two dotted lines in FIG. 5 may be employed. The external blower 160 is located at the other side (−DT side) in the height direction DT of the housing 31. The external blower 160 is e.g. an axial fan. The external blower 160 sends an air AR4 from the outside of the housing 31 to the housing 31. More specifically, the external blower 160 sends the air AR4 from the other side (−DT side) to the one side (+DT side) of the housing 31 in the height direction DT. The air AR4 is sent by the external blower 160 and the air AR2 in the internal space 35 may be cooled from the outside of the housing 31. Thereby, the vapor contained in the air AR2 may be condensed more easily and the refrigerant production efficiency may be further improved. Particularly, when the heat absorbing portions are fins provided in the inner side surfaces of the internal space, the housing is cooled by the external blower 160 and the air in the internal space is cooled via the fins provided in the inner side surfaces of the internal space, and thus, the vapor may be condensed more easily in the inner side surfaces of the internal space. Note that the external blower 160 may be a centrifugal fan.

A plurality of fins may be provided in the outer wall surfaces of the housing. According to the configuration, heat may be easily released from the inside of the housing to the outside. Accordingly, the air in the internal space may be cooled more easily. Particularly, air is sent to the plurality of fins provided in the outer wall surfaces of the housing by the above described external blower, and thereby, the air in the internal space may be cooled more easily. Therefore, the refrigerant production efficiency may be further improved.

The refrigerant sender may have a trapping portion formed using a porous member placed in the internal space. The trapping portion is connected to the coupling part, and the refrigerant produced in the internal space may be absorbed by the trapping portion and transferred to the coupling part. Thereby, the produced refrigerant may be sent to the cooling target without waste.

The heater is not limited to that of the above described embodiments. The heater may heat the moisture absorbing and desorbing member in contact with the moisture absorbing and desorbing member. In this case, the heater does not necessarily heat the air before passing through the moisture absorbing and desorbing member.

In the above described embodiments, the cooling blower is the first blower 60 provided in the refrigerant generator 20, but not limited to that. The cooling blower may be separately provided in addition to the blower provided in the refrigerant generator 20. The refrigerant is not particularly limited to water as long as the refrigerant can cool the cooling target.

Further, in the above described embodiments, the cooling target is the light modulation units, however, not limited to those. The cooling target may include at least one of the light modulators, the light modulation units, the light source, a wavelength conversion element that converts the wavelength of the light output from the light source, a diffusion element that diffuses the light output from the light source, or a polarization conversion element that converts the polarization direction of the light output from the light source. According to the configuration, the respective parts of the projector may be cooled in the same manner as described above.

In the above described embodiments, the example of the case where the present disclosure is applied to the transmissive-type projector is explained, however, the present disclosure can be applied to a reflective-type projector. Here, "transmissive-type" refers to a type in which a light modulator including a liquid crystal panel transmits light. "Reflective-type" refers to a type in which a light modulator reflects light. Note that the light modulator is not limited to the liquid crystal panel or the like, but may be e.g. a light modulator using a micromirror.

In the above described embodiments, the example of the projector using the three light modulators is taken as an example, however, the present disclosure can be applied to a projector using only one light modulator or a projector using four or more light modulators.

The respective configurations explained in this specification may be appropriately combined within a range in which the configurations are mutually consistent.

What is claimed is:

1. A projector having a cooling target comprising:
a light source configured to emit a light;
a light modulator configured to modulate the light emitted from the light source according to an image signal; and
a cooling apparatus configured to cool the cooling target based on a transformation of a refrigerant into a gas, wherein
the cooling apparatus includes
a refrigerant generator configured to generate the refrigerant, and
a refrigerant sender configured to send the generated refrigerant toward the cooling target,
the refrigerant generator includes
a rotating moisture absorbing and desorbing member,
a first blower configured to deliver air to a first part of the moisture absorbing and desorbing member located in a first region,
a heat exchanger coupled to the refrigerant sender,
a heater configured to heat a second part of the moisture absorbing and desorbing member located in a second region different from the first region, and
a second blower configured to deliver air around the second part heated by the heater to the heat exchanger,
the heat exchanger includes
a housing having an internal space into which the air delivered by the second blower flows, and
a heat absorbing portion disposed in the internal space, the heat absorbing portion removing heat from the air in the internal space to generate the refrigerant,
the housing includes an inlet port through which the air flows into the internal space and an outlet port through which the air is exhausted from the internal space, and
an air guide portion configured to guide the air flowing into the internal space is disposed in the internal space.

2. The projector according to claim 1, wherein
the air guide portion is located between the inlet port and the outlet port.

3. The projector according to claim 1, wherein
the inlet port is provided in a first side wall portion at one side in a first direction out of a plurality of side wall portions forming the housing, and
the outlet port is provided in a second side wall portion at the other side in the first direction out of the plurality of side wall portions.

4. The projector according to claim 3, wherein
the inlet port and the outlet port overlap each other as seen along the first direction, and
the air guide portion is located between the inlet port and the outlet port in the first direction.

5. The projector according to claim 3, wherein
the inlet port is provided in a part closer to one side in a second direction orthogonal to the first direction in the first side wall portion,
the outlet port is provided in a part closer to the one side in the second direction in the second side wall portion, and
a distance between the air guide portion and a third side wall portion at the other side in the second direction out of the plurality of side wall portions is larger than a distance between the air guide portion and a fourth side wall portion at the one side in the second direction out of the plurality of side wall portions.

6. The projector according to claim 5, wherein
the inlet port is provided in a part closer to one side in a third direction orthogonal to both the first direction and the second direction in the first side wall portion,
the outlet port is provided in a part closer to the one side in the third direction in the second side wall portion, and
a distance between the air guide portion and a fifth side wall portion at the other side in the third direction out of the plurality of side wall portions is larger than a distance between the air guide portion and a sixth side wall portion at the one side in the third direction out of the plurality of side wall portions.

7. The projector according to claim 1, wherein
both the inlet port and the outlet port are provided in a first side wall portion at one side in a first direction out of a plurality of side wall portions forming the housing, and
the air guide portion is located between the inlet port and the outlet port as seen along the first direction.

8. The projector according to claim 7, wherein
a distance between the air guide portion and a second side wall portion at the other side in the first direction out of the plurality of side wall portions is larger than a distance between the air guide portion and the first side wall portion.

9. The projector according to claim 7, wherein
the inlet port and the outlet port are provided in apart closer to one side in a second direction orthogonal to the first direction in the first side wall portion, and
a distance between the air guide portion and a third side wall portion at the other side in the second direction out of the plurality of side wall portions is larger than a distance between the air guide portion and a fourth side wall portion at the one side in the second direction out of the plurality of side wall portions.

10. The projector according to claim 1, wherein
the heat exchanger includes a fixing portion connecting the air guide portion and an inner wall surface of the housing and fixing the air guide portion, and
the air guide portion is disposed apart from the inner wall surface of the housing.

11. The projector according to claim 1, wherein
the air guide portion has a curved shape.

12. The projector according to claim 1, wherein
the air guide portion has a corrugated shape.

13. The projector according to claim 1, wherein
the air guide portion has a through hole penetrating the air guide portion.

14. The projector according to claim 1, wherein
the air guide portion contacts the heat absorbing portion, and
the air guide portion and the heat absorbing portion are formed of metals.

15. The projector according to claim 1, wherein
the air guide portion includes an air guide portion main body and a projecting portion projecting from the air guide portion main body.

16. The projector according to claim 1, wherein
a plurality of the air guide portions are provided.

17. The projector according to claim 1, wherein
the heat absorbing portion is a channel having an inner part isolated from the internal space and a plurality of the heat absorbing portions are provided, and
cooling air for cooling air in the internal space via the channel portions circulates in the inner parts of the plurality of channels.

18. The projector according to claim 1, wherein
the cooling target is the light modulator.

* * * * *